(12) United States Patent
Wang et al.

(10) Patent No.: US 10,972,217 B2
(45) Date of Patent: Apr. 6, 2021

(54) SCHEDULING FOR LOW-DENSITY PARITY-CHECK CODES

(71) Applicant: QUALCOMM incorporated, San Diego, CA (US)

(72) Inventors: Ying Wang, San Diego, CA (US); Jing Jiang, San Diego, CA (US); Peter John Black, La Jolla, CA (US); Joseph Binamira Soriaga, San Diego, CA (US); Gabi Sarkis, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 4 days.

(21) Appl. No.: 16/366,997

(22) Filed: Mar. 27, 2019

(65) Prior Publication Data

US 2019/0305882 A1 Oct. 3, 2019

Related U.S. Application Data

(60) Provisional application No. 62/650,705, filed on Mar. 30, 2018.

(51) Int. Cl.
*H03M 13/00* (2006.01)
*H04L 1/00* (2006.01)
*H03M 13/11* (2006.01)

(52) U.S. Cl.
CPC .......... *H04L 1/0045* (2013.01); *H03M 13/114* (2013.01); *H03M 13/116* (2013.01);
(Continued)

(58) Field of Classification Search
CPC ............ H04L 1/0045; H03M 13/1128; H03M 13/114; H03M 13/116; H03M 13/6306; H03M 13/6362; H03M 13/6393
(Continued)

(56) References Cited

U.S. PATENT DOCUMENTS 8,219,873 B1 7/2012 Ng et al.
2016/0294416 A1* 10/2016 Hsieh ................. H03M 13/1142
(Continued)

OTHER PUBLICATIONS

Aslam C.A., et al., "Edge-based Dynamic Scheduling for Belief-propagation Decoding of LDPC and RS Codes," IEEE Transactions on Communications, IEEE Service Center, Piscataway, NJ, USA, vol. 65 (2), Feb. 1, 2017, pp. 525-535, XP011641164, ISSN: 0090-6778, DOI: 10.1109/TCOMM.2016.2637913 [retrieved on Feb. 14, 2017] the whole document.
(Continued)

*Primary Examiner* — Christine T. Tu
(74) *Attorney, Agent, or Firm* — Holland & Hart LLP/Qualcomm Incorporated

(57) ABSTRACT

Methods, systems, and devices for wireless communications are described. Efficient low-density parity-check (LDPC) scheduling of layered decoding may include receiving a message encoded as an LDPC code that includes a number of check nodes and a number of bit nodes, applying a first number of decoding iterations to decoding the message, applying a second number of decoding iterations to decoding the message after the first number of decoding iterations are applied, and decoding the message through completion of both the first number of decoding iterations and the second number of decoding iterations. In some cases, only a portion of the number of check nodes is decoded during each of the first number of decoding iterations and all of the number of check nodes are decoded during each of the second number of decoding iterations.

30 Claims, 14 Drawing Sheets

(52) U.S. Cl.
CPC .... H03M 13/1128 (2013.01); *H03M 13/6306* (2013.01); *H03M 13/6362* (2013.01); *H03M 13/6393* (2013.01)

(58) Field of Classification Search
USPC ........................................ 714/776, 755, 758
See application file for complete search history.

(56) References Cited

U.S. PATENT DOCUMENTS

2017/0093428 A1* 3/2017 Yen ..................... H03M 13/658
2017/0366201 A1* 12/2017 Jain ..................... H03M 13/616
2018/0343082 A1* 11/2018 Xiong ................ H03M 13/1128

OTHER PUBLICATIONS

Ha J., et al: "Layered BP Decoding for Rate-Compatible Punctured LDPC Codes," IEEE Communications Letters, IEEE Service Center, Piscataway, NJ, US, vol. 11 (5), May 1, 2007, pp. 440-442, XP011181409, ISSN: 1089-7798, DOI: 10.1109/LCOMM.2007.061962 the whole document.
International Search Report and Written Opinion—PCT/US2019/024539—ISA/EPO—Jun. 25, 2019 (181389WO).
Zhang J., et al., "Check-node Lazy Scheduling Approach for Layered Belief Propagation Decoding Algorithm," Electronics LET, IEE Stevenage, GB, vol. 50 (4), Feb. 13, 2014, pp. 278-279, XP006046738, ISSN: 0013-5194, DOI: 10-1049/EL.2013.3199 the whole document.
Kim M., et al., "Serial Scheduling Algorithm of LDPC Decoding for Multimedia Transmission," Proc., IEEE International Symposium on Broadband Multimedia Systems and Broadcasting, BMSB 2012, IEEE, Jun. 27, 2012, pp. 1-4, XP032222367, DOI: 10.1109/BMSB.2012.6264324 ISBN: 978-1-4673-0293-7 the whole document.
ZTE Microelectronics: "Consideration on LDPC Design for NR," 3GPP Draft; R1-1611112 Consideration on LDPC Codes for NR Final, 3rd Generation Partnership Project (3GPP), Mobile Competence Centre; 650, Route Des Lucioles; F-06921 Sophia-Antipolis Cedex; France, vol. RAN WG1, No. Reno, USA; Nov. 14, 2016-Nov. 18, 2014, Nov. 13, 2016, XP051175094, 16 pages, Retrieved from the Internet: URL: http://www.3gpp.org/ftp/Meetings_3GPP_SYNC/RAN1/Docs/ [retrieved on Nov. 13, 2016].

* cited by examiner

| Iteration 1 | Scheduling Order of Check Node Update |||||||||||||
|---|---|---|---|---|---|---|---|---|---|---|---|---|---|
| | 0 | 1 | 2 | 3 | 4 | 5 | 6 | 7 | 8 | 9 | 10 | 11 | 12 |

500

Scheduling Order of Check Node Update — 610

| | | | | | | | | | | | |
|---|---|---|---|---|---|---|---|---|---|---|---|
| 1  | 4 | 6 | 7  | 10 | 12 | -1 | ... | -1 | -1 | -1 | -1 |
| 2  | 4 | 6 | 7  | 10 | 12 | -1 | ... | -1 | -1 | -1 | -1 |
| 3  | 4 | 6 | 7  | 10 | 12 | -1 | ... | -1 | -1 | -1 | -1 |
| 4  | 4 | 6 | 7  | 10 | 12 | -1 | ... | -1 | -1 | -1 | -1 |
| 5  | 4 | 7 | 10 | 12 | 5  | 11 | ... | 0  | 1  | 2  | 3  |
| 6  | 4 | 7 | 10 | 12 | 5  | 11 | ... | 0  | 1  | 2  | 3  |
| 7  | 4 | 7 | 10 | 12 | 5  | 11 | ... | 0  | 1  | 2  | 3  |
| 8  | 4 | 7 | 10 | 12 | 5  | 11 | ... | 0  | 1  | 2  | 3  |
| 9  | 4 | 7 | 10 | 12 | 5  | 11 | ... | 0  | 1  | 2  | 3  |
| 10 | 4 | 7 | 10 | 12 | 5  | 11 | ... | 0  | 1  | 2  | 3  |
| 11 | 4 | 7 | 10 | 12 | 5  | 11 | ... | 0  | 1  | 2  | 3  |
| 12 | 4 | 7 | 10 | 12 | 5  | 11 | ... | 0  | 1  | 2  | 3  |

Scheduling Order of Check Node Update

| | | | | | | | | | | | |
|---|---|---|---|---|---|---|---|---|---|---|---|
| 1  | 10 | 6 | 4 | 7 | 12 | -1 | ... | -1 | -1 | -1 | -1 |
| 2  | 10 | 6 | 4 | 7 | 12 | 5  | ... | -1 | -1 | -1 | -1 |
| 3  | 10 | 6 | 4 | 7 | 12 | 5  | ... | -1 | -1 | -1 | -1 |
| 4  | 10 | 6 | 4 | 7 | 12 | 5  | ... | -1 | -1 | -1 | -1 |
| 5  | 10 | 6 | 4 | 7 | 12 | 5  | ... | 0  | 1  | 2  | 3  |
| 6  | 10 | 6 | 4 | 7 | 12 | 5  | ... | 0  | 1  | 2  | 3  |
| 7  | 10 | 6 | 4 | 7 | 12 | 5  | ... | 0  | 1  | 2  | 3  |
| 8  | 10 | 6 | 4 | 7 | 12 | 5  | ... | 0  | 1  | 2  | 3  |
| 9  | 10 | 6 | 4 | 7 | 12 | 5  | ... | 0  | 1  | 2  | 3  |
| 10 | 10 | 6 | 4 | 7 | 12 | 5  | ... | 0  | 1  | 2  | 3  |
| 11 | 10 | 6 | 4 | 7 | 12 | 5  | ... | 0  | 1  | 2  | 3  |
| 12 | 10 | 6 | 4 | 7 | 12 | 5  | ... | 0  | 1  | 2  | 3  |

FIG. 7

SCHEDULING FOR LOW-DENSITY PARITY-CHECK CODES

CROSS REFERENCES

The present Application for patent claims the benefit of U.S. Provisional Patent Application No. 62/650,705 by WANG et al., entitled "Scheduling for Low-Density Parity-Check Codes," filed Mar. 30, 2018, assigned to the assignee hereof, and expressly incorporated by reference herein.

BACKGROUND

The following relates generally to wireless communication, and more specifically to scheduling for low-density parity-check (LDPC) codes.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform-spread-OFDM (DFT-S-OFDM). A wireless multiple-access communications system may include a number of base stations or network access nodes, each simultaneously supporting communication for multiple communication devices, which may be otherwise known as user equipment (UE).

Wireless communications systems may use channel coding to increase reliability and robustness of wireless transmissions, particularly in the presence of noise or interference in wireless channels. One category of codes that may be suitable for channel coding includes LDPC codes, and improved systems and methods for using LDPC decoding may be desired.

SUMMARY

The described techniques relate to improved methods, systems, devices, or apparatuses that support scheduling for low-density parity-check (LDPC) codes in layered decoding. Generally, the described techniques provide for decoding a message encoded as an LDPC code by completing a first number of partial decoding iterations and a second number of full decoding iterations. In some examples, a base graph of an LDPC code may include bit nodes and check nodes. The connections between a check node and the bit nodes may be used to determine a degree of a check node. In some examples of a base graph of LDPC codes, the first two bit nodes may be punctured. Thus, a check node connected to any one or both of the punctured bit nodes may be decoded less reliably than a check node not connected to the punctured bit nodes during a single decoding iteration. Additionally, the present techniques provide for decoding LDPC codes according to a scheduling order and for determining the scheduling order. In some examples, the scheduling order may be based on a degree associated with a check node. In some cases, lower degree check nodes may be updated prior to updating higher degree check nodes. In some examples, check nodes associated with a portion of the base graph may be decoded prior to decoding check nodes associated with the remaining portion of the base graph. In some other cases, the scheduling order may be based on a number of punctured bits that a check node is connected to. In some cases, the determined scheduling order may also be based on an extrinsic information transfer (EXIT) chart optimization.

A method of wireless communication is described. The method may include receiving a message encoded as an LDPC code that includes a plurality of check nodes and a plurality of bit nodes, and applying a first number of decoding iterations to decoding the message. In some cases, only a portion of the plurality of check nodes is decoded during each of the first number of decoding iterations. The method may further include applying a second number of decoding iterations to decoding the message after the first number of decoding iterations are applied, and decoding the message through completion of both the first number of decoding iterations and the second number of decoding iterations. In some cases, all of the plurality of check nodes are decoded during each of the second number of decoding iterations.

An apparatus for wireless communication is described. The apparatus may include means for receiving a message encoded as an LDPC code that includes a plurality of check nodes and a plurality of bit nodes, means for applying a first number of decoding iterations to decoding the message, means for applying a second number of decoding iterations to decoding the message after the first number of decoding iterations are applied, and means for decoding the message through completion of both the first number of decoding iterations and the second number of decoding iterations. In some cases, only a portion of the plurality of check nodes is decoded during each of the first number of decoding iterations and all of the plurality of check nodes are decoded during each of the second number of decoding iterations.

Another apparatus for wireless communication is described. The apparatus may include a processor, memory coupled with the processor, and instructions stored in the memory. The instructions may be operable to cause the processor to receive a message encoded as an LDPC code that includes a plurality of check nodes and a plurality of bit nodes, apply a first number of decoding iterations to decoding the message, apply a second number of decoding iterations to decoding the message after the first number of decoding iterations are applied, and decode the message through completion of both the first number of decoding iterations and the second number of decoding iterations. In some cases, only a portion of the plurality of check nodes is decoded during each of the first number of decoding iterations and all of the plurality of check nodes are decoded during each of the second number of decoding iterations.

A non-transitory computer-readable medium for wireless communication is described. The non-transitory computer-readable medium may include instructions operable to cause a processor to receive a message encoded as a low-density parity-check (LDPC) code that includes a plurality of check nodes and a plurality of bit nodes, apply a first number of decoding iterations to decoding the message, apply a second number of decoding iterations to decoding the message after the first number of decoding iterations are applied, and decode the message through completion of both the first number of decoding iterations and the second number of decoding iterations. In some cases, only a portion of the plurality of check nodes is decoded during each of the first number of decoding iterations and all of the plurality of check nodes are decoded during each of the second number of decoding iterations.

Some examples of the method, apparatus, and non-transitory computer-readable medium described herein may further include processes, features, means, or instructions for identifying the portion of the plurality of check nodes as low-degree check nodes having a degree that may be less than a threshold.

Some examples of the method, apparatus, and non-transitory computer-readable medium described herein may further include processes, features, means, or instructions for identifying an order for decoding the portion of the plurality of check nodes during the first number of decoding iterations. In some cases, the first number of decoding iterations may be applied according to the identified order.

Some examples of the method, apparatus, and non-transitory computer-readable medium described herein may further include processes, features, means, or instructions for identifying an order for decoding all of the plurality of check nodes during the second number of decoding iterations. In some cases, the second number of decoding iterations may be applied according to the identified order.

Some examples of the method, apparatus, and non-transitory computer-readable medium described herein may further include processes, features, means, or instructions for reordering the plurality of check nodes for decoding during one or both of the first number of decoding iterations and the second number of decoding iterations based on a scheduling configuration.

Some examples of the method, apparatus, and non-transitory computer-readable medium described herein may further include processes, features, means, or instructions for identifying the scheduling configuration based on a rate of the LDPC code.

Some examples of the method, apparatus, and non-transitory computer-readable medium described herein may further include processes, features, means, or instructions for selecting the scheduling configuration from a plurality of scheduling configurations which vary uniformly from supporting a high rate of the LDPC code to a low rate of the LDPC code.

Some examples of the method, apparatus, and non-transitory computer-readable medium described herein may further include processes, features, means, or instructions for reordering the plurality of check nodes for decoding during one or both of the first number of decoding iterations and the second number of decoding iterations based on a degree of each of the plurality of check nodes.

Some examples of the method, apparatus, and non-transitory computer-readable medium described herein may further include processes, features, means, or instructions for determining a number of punctured bits connected to each of the plurality of check nodes.

Some examples of the method, apparatus, and non-transitory computer-readable medium described herein may further include processes, features, means, or instructions for reordering the plurality of check nodes for decoding during one or both of the first number of decoding iterations and the second number of decoding iterations based on the number of punctured bits connected to each of the plurality of check nodes.

In some examples of the method, apparatus, and non-transitory computer-readable medium described herein, the number of punctured bits may be limited to a number of punctured bits within a range of the plurality of bit nodes.

In some examples of the method, apparatus, and non-transitory computer-readable medium described herein, the number of punctured bits may be limited to the number of punctured bits within a first bit node and a second bit node of the plurality of bit nodes. In some cases, a number of bits in each bit node may be based on a lifting size of the LDPC code.

Some examples of the method, apparatus, and non-transitory computer-readable medium described herein may further include processes, features, means, or instructions for reordering the plurality of check nodes for decoding during one or both of the first number of decoding iterations and the second number of decoding iterations based on an EXIT chart optimization.

BRIEF DESCRIPTION OF THE DRAWINGS

FIG. 6 illustrates an example of a scheduling order that supports scheduling for LDPC codes in accordance with aspects of the present disclosure.

FIG. 7 illustrates an example of a scheduling order that supports scheduling for LDPC codes in accordance with aspects of the present disclosure.

DETAILED DESCRIPTION

Figure 1:
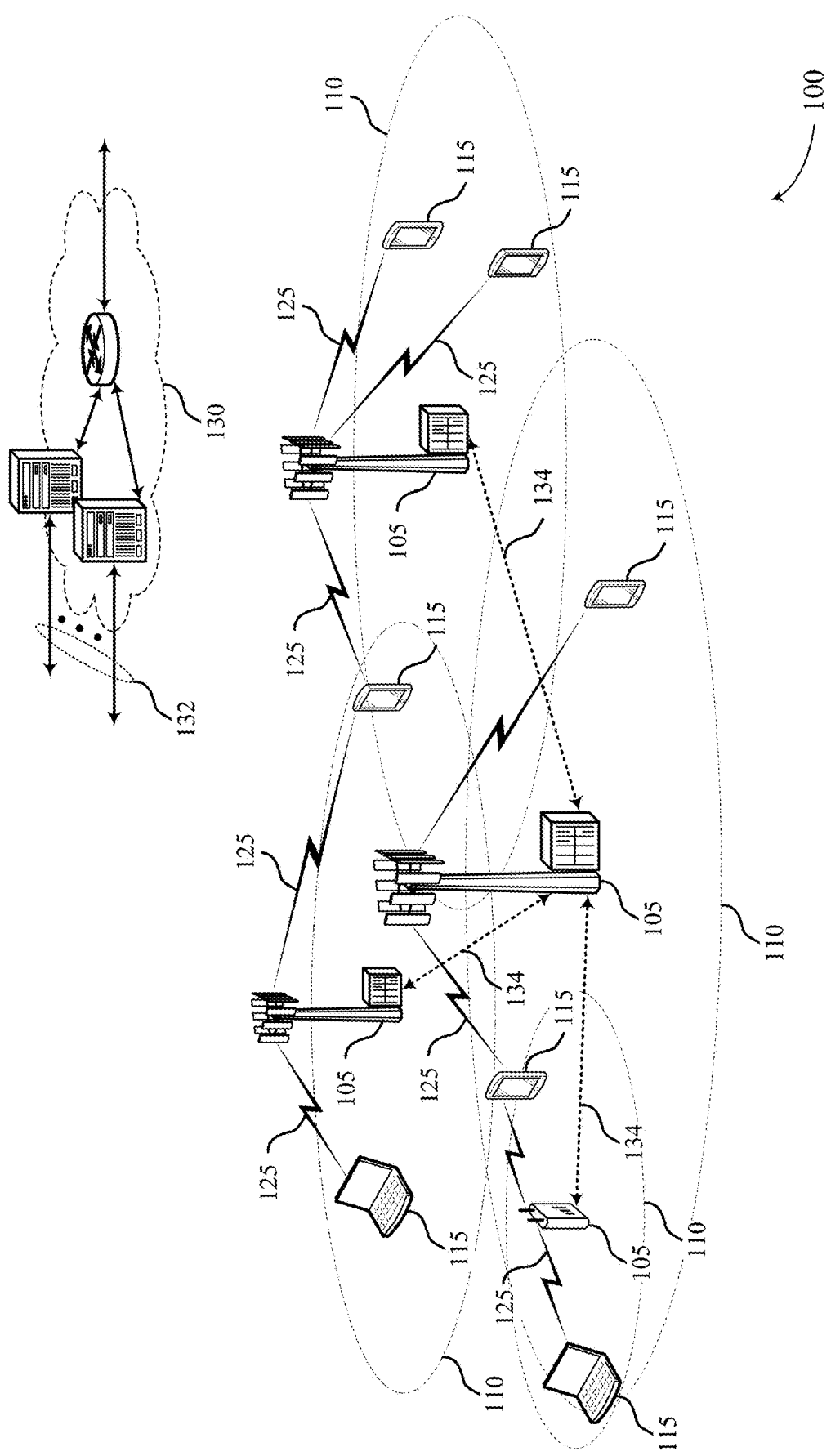
FIG. 1 illustrates an example of a system for wireless communication that supports scheduling for low-density parity-check (LDPC) codes in accordance with aspects of the present disclosure.

Wireless communications systems may use channel coding to increase reliability and robustness of wireless transmissions, particularly in the presence of noise or interference in wireless channels. In some examples, wireless communications systems may use various channel coding techniques, such as low-density parity-check (LDPC) coding, to overcome noisy channel conditions and interference. For example, wireless devices may send information bits to one another (e.g., from a base station to a user equipment (UE), or vice versa), which may be encoded to generate a codeword. In some cases, additional bits are included in an attempt to control errors caused by interference from unreliable or noisy channels. A receiver may then use the additional bits to recover the transmitted information bits.

An LDPC code may use a parity check matrix, where each row of the parity check matrix may introduce a parity check constraint on a codeword vector. For example, when using the parity check matrix to decode an LDPC codeword, for every row of the parity check matrix, the product of the codeword vector and each respective row of the parity check matrix should be equal to zero. The receiver may use this information to identify the information bits within the codeword. In other words, each row of the parity check matrix provides a respective parity check for individual bits of the codeword. In some cases, the parity check matrix may include a base graph.

The base graph may include bit nodes and check nodes. In some examples, each check node may be connected to a set of bit nodes. The connections between the check node and the bit nodes may be used to determine a degree of the check node. Using prior techniques, LDPC decoding may be performed by serially updating a first row of the base graph through the last row. Thus, a decoder employing traditional means of layered decoding may, during a first iteration, first update a first check node. Then, the decoder may move on to the second check node, and so on. This may lead to inefficient decoding, as each check node may be associated with a different degree, and lower degree check nodes being typically more easily resolved (through fewer iterations) than higher degree check nodes.

Further, in some examples of a base graph of LDPC codes, the first two bit nodes may be punctured. Thus, a check node connected to any one or both of the punctured bit nodes may be decoded less reliably than a check node not connected to the punctured bit nodes. In some examples, the conventional techniques of LDPC decoding may not account for connection of a check node to known punctured bit nodes. An LDPC decoder may benefit from the knowledge regarding known punctured bit nodes by altering a predetermined scheduling order. In some examples, the altered scheduling order may be based on a degree associated with a check node. In some cases, a decoder may be configured to update lower degree check nodes prior to updating the remaining check nodes of a base graph. In some other cases, the scheduling order may be based on a number of punctured bits that a check node is connected to. In some cases, the scheduling order may be based on an extrinsic information transfer (EXIT) chart optimization. According to some aspects of the present disclosure, a decoder may also partially decode a portion of the base graph during some initial iterations prior to applying full decoding iterations. The process of initially using partially decoding iterations, followed by the use of full decoding iterations, as well as an updated decoding schedule, may reduce decoding complexity and improve decoding efficiency.

Aspects of the disclosure are initially described in the context of a wireless communications system and efficient techniques for LDPC decoding. Aspects of the disclosure are further illustrated by and described with reference to apparatus diagrams, system diagrams, and flowcharts that relate to decoding LDPC codes.

FIG. 1 illustrates an example of a wireless communications system 100 in accordance with various aspects of the present disclosure. The wireless communications system 100 includes base stations 105, UEs 115, and a core network 130. In some examples, the wireless communications system 100 may be a Long Term Evolution (LTE) network, an LTE-Advanced (LTE-A) network, an LTE-A Pro network, or a New Radio (NR) network. In some cases, wireless communications system 100 may support enhanced broadband communications, ultra-reliable (e.g., mission critical) communications, low latency communications, or communications with low-cost and low-complexity devices.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation Node B or giga-nodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions from a base station 105 to a UE 115. Downlink transmissions may also be called forward link transmissions while uplink transmissions may also be called reverse link transmissions.

The geographic coverage area 110 for a base station 105 may be divided into sectors making up only a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap, and overlapping geographic coverage areas 110 associated with different technologies may be supported by the same base station 105 or by different base stations 105. The wireless communications system 100 may include, for example, a heterogeneous LTE/LTE-A/LTE-A Pro or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples, half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P) or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105, or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an S1 or other interface). Base stations 105 may communicate with one another over backhaul links 134 (e.g., via an X2 or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 MHz to 300 GHz. Generally, the region from 300 MHz to 3 GHz is known as the ultra-high frequency (UHF) region or decimeter band, since the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that can tolerate interference from other users.

Wireless communications system 100 may also operate in an extremely high frequency (EHF) region of the spectrum (e.g., from 30 GHz to 300 GHz), also known as the millimeter band. In some examples, wireless communications system 100 may support millimeter wave (mmW) communications between UEs 115 and base stations 105, and EHF antennas of the respective devices may be even smaller and more closely spaced than UHF antennas. In some cases, this may facilitate use of antenna arrays within a UE 115. However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ License Assisted Access (LAA), LTE-Unlicensed (LTE-U) radio access technology, or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a CA configuration in conjunction with CCs operating in a licensed band (e.g., LAA). Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some examples, base station 105 or UE 115 may be equipped with multiple antennas, which may be used to employ techniques such as transmit diversity, receive diversity, multiple-input multiple-output (MIMO) communications, or beamforming. For example, wireless communications system 100 may use a transmission scheme between a transmitting device (e.g., a base station 105) and a receiving device (e.g., a UE 115), where the transmitting device is equipped with multiple antennas and the receiving devices are equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream, and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In one example, a base station 105 may use multiple antennas or antenna arrays to conduct beamforming operations for directional communications with a UE 115. For instance, some signals (e.g., synchronization signals, reference signals, beam selection signals, or other control signals) may be transmitted by a base station 105 multiple times in different directions, which may include a signal being transmitted according to different beamforming weight sets associated with different directions of transmission. Transmissions in different beam directions may be used to identify (e.g., by the base station 105 or a receiving device, such as a UE 115) a beam direction for subsequent transmission and/or reception by the base station 105. Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based at least in in part on a signal that was transmitted in different beam directions. For example, a UE 115 may receive one or more of the signals transmitted by the base station 105 in different directions, and the UE 115 may report to the base station 105 an indication of the signal it received with a highest signal quality, or an otherwise acceptable signal quality. Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115), or transmitting a signal in a single direction (e.g., for transmitting data to a receiving device).

A receiving device (e.g., a UE 115, which may be an example of a mmW receiving device) may try multiple receive beams when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets applied to signals received at a number of antenna elements of an antenna array, or by processing received signals according to different receive beamforming weight sets applied to signals received at a number of antenna elements of an antenna array, any of which may be referred to as "listening" according to different receive beams or receive directions. In some examples, a receiving device may use a single receive beam to receive along a single beam direction (e.g., when receiving a data signal). The single receive beam may be aligned in a beam direction determined based on listening according to different receive beam directions (e.g., a beam direction determined to have a highest signal strength, highest signal-to-noise ratio, or otherwise acceptable signal quality based on listening according to multiple beam directions).

In some cases, the antennas of a base station 105 or UE 115 may be located within one or more antenna arrays, which may support MIMO operations, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use hybrid automatic repeat request (HARQ) to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical (PHY) layer, transport channels may be mapped to physical channels.

In some cases, UEs 115 and base stations 105 may support retransmissions of data to increase the likelihood that data is received successfully. HARQ feedback is one technique of increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., signal-to-noise conditions). In some cases, a wireless device may support same-slot HARQ feedback, where the device may provide HARQ feedback in a specific slot for data received in a previous symbol in the slot. In other cases, the device may provide HARQ feedback in a subsequent slot, or according to some other time interval.

Time intervals in LTE or NR may be expressed in multiples of a basic time unit, which may, for example, refer to a sampling period of $T_s=1/30,720,000$ seconds. Time intervals of a communications resource may be organized according to radio frames each having a duration of 10 milliseconds (ms), where the frame period may be expressed as $T_f=307,200\ T_s$. The radio frames may be identified by a system frame number (SFN) ranging from 0 to 1023. Each frame may include 10 subframes numbered from 0 to 9, and each subframe may have a duration of 1 ms. A subframe may be further divided into 2 slots each having a duration of 0.5 ms, and each slot may contain 6 or 7 modulation symbol periods (e.g., depending on the length of the cyclic prefix prepended to each symbol period). Excluding the cyclic prefix, each symbol period may contain 2048 sampling periods. In some cases a subframe may be the smallest scheduling unit of the wireless communications system 100, and may be referred to as a transmission time interval (TTI). In other cases, a smallest scheduling unit of the wireless communications system 100 may be shorter than a subframe or may be dynamically selected (e.g., in bursts of shortened TTIs (sTTIs) or in selected component carriers using sTTIs).

In some wireless communications systems, a slot may further be divided into multiple mini-slots containing one or more symbols. In some instances, a symbol of a mini-slot or a mini-slot may be the smallest unit of scheduling. Each symbol may vary in duration depending on the subcarrier spacing or frequency band of operation, for example. Further, some wireless communications systems may implement slot aggregation in which multiple slots or mini-slots are aggregated together and used for communication between a UE 115 and a base station 105.

The term "carrier" refers to a set of radio frequency spectrum resources having a defined physical layer structure for supporting communications over a communication link 125. For example, a carrier of a communication link 125 may include a portion of a radio frequency spectrum band that is operated according to physical layer channels for a given radio access technology. Each physical layer channel may carry user data, control information, or other signaling. A carrier may be associated with a pre-defined frequency channel (e.g., an E-UTRA absolute radio frequency channel number (EARFCN)), and may be positioned according to a channel raster for discovery by UEs 115. Carriers may be downlink or uplink (e.g., in an FDD mode), or be configured to carry downlink and uplink communications (e.g., in a TDD mode). In some examples, signal waveforms transmitted over a carrier may be made up of multiple sub-carriers (e.g., using multi-carrier modulation (MCM) techniques such as OFDM or DFT-s-OFDM).

The organizational structure of the carriers may be different for different radio access technologies (e.g., LTE, LTE-A, LTE-A Pro, NR, etc.). For example, communications over a carrier may be organized according to TTIs or slots, each of which may include user data as well as control information or signaling to support decoding the user data. A carrier may also include dedicated acquisition signaling (e.g., synchronization signals or system information, etc.) and control signaling that coordinates operation for the carrier. In some examples (e.g., in a carrier aggregation configuration), a carrier may also have acquisition signaling or control signaling that coordinates operations for other carriers.

Physical channels may be multiplexed on a carrier according to various techniques. A physical control channel and a physical data channel may be multiplexed on a downlink carrier, for example, using time division multiplexing (TDM) techniques, frequency division multiplexing (FDM) techniques, or hybrid TDM-FDM techniques. In some examples, control information transmitted in a physical control channel may be distributed between different control regions in a cascaded manner (e.g., between a common control region or common search space and one or more UE-specific control regions or UE-specific search spaces).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of predetermined bandwidths for carriers of a particular radio access technology (e.g., 1.4, 3, 5, 10, 15, 20, 40, or 80 MHz). In some examples, each served UE 115 may be configured for operating over portions or all of the carrier bandwidth. In other examples, some UEs 115 may be configured for operation using a narrowband protocol type that is associated with a predefined portion or range (e.g., set of subcarriers or RBs) within a carrier (e.g., "in-band" deployment of a narrowband protocol type).

In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme). Thus, the more resource elements that a UE 115 receives and the higher the order of the modulation scheme, the higher the data rate may be for the UE 115. In MIMO systems, a wireless communications resource may refer to a combination of a radio frequency spectrum resource, a time resource, and a spatial resource (e.g., spatial layers), and the use of multiple spatial layers may further increase the data rate for communications with a UE 115.

Devices of the wireless communications system 100 (e.g., base stations 105 or UEs 115) may have a hardware configuration that supports communications over a particular carrier bandwidth, or may be configurable to support communications over one of a set of carrier bandwidths. In some examples, the wireless communications system 100 may include base stations 105 and/or UEs that can support simultaneous communications via carriers associated with more than one different carrier bandwidth.

Wireless communications system 100 may support communication with a UE 115 on multiple cells or carriers, a feature which may be referred to as carrier aggregation (CA) or multi-carrier operation. A UE 115 may be configured with multiple downlink CCs and one or more uplink CCs according to a carrier aggregation configuration. Carrier aggregation may be used with both FDD and TDD component carriers.

In some cases, wireless communications system 100 may utilize enhanced component carriers (eCCs). An eCC may be characterized by one or more features including wider carrier or frequency channel bandwidth, shorter symbol duration, shorter TTI duration, or modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (e.g., where more than one operator is allowed to use the spectrum). An eCC characterized by wide carrier bandwidth may include one or more segments that may be utilized by UEs 115 that are not capable of monitoring the whole carrier bandwidth or are otherwise configured to use a limited carrier bandwidth (e.g., to conserve power).

In some cases, an eCC may utilize a different symbol duration than other CCs, which may include use of a reduced symbol duration as compared with symbol durations of the other CCs. A shorter symbol duration may be associated with increased spacing between adjacent subcarriers. A device, such as a UE 115 or base station 105, utilizing eCCs may transmit wideband signals (e.g., according to frequency channel or carrier bandwidths of 20, 40, 60, 80 MHz, etc.) at reduced symbol durations (e.g., 16.67 microseconds). A TTI in eCC may consist of one or multiple symbol periods. In some cases, the TTI duration (that is, the number of symbol periods in a TTI) may be variable.

Wireless communications systems such as an NR system may utilize any combination of licensed, shared, and unlicensed spectrum bands, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across frequency) and horizontal (e.g., across time) sharing of resources.

In some examples, a UE 115 or a base station 105 may receive a message encoded as an LDPC code. In some cases, the LDPC code may include a number of check nodes and a number of bit nodes. Upon receiving the LDPC code, the UE 115 or the base station 105 may identify a portion of the number of check nodes as low-degree check nodes having a degree that is less than a threshold. The UE 115 or the base station 105 may then identify an order for decoding the portion of the number of check nodes during a first number of decoding iterations. In some cases, the UE 115 or the base station 105 may apply the first number of decoding iterations to decoding the message. In some examples, only a portion of the number of check nodes is decoded during each of the first number of decoding iterations. The UE 115 or the base station 105 may then identify another order for decoding all of the number of check nodes during a second number of decoding iterations. The UE 115 or the base station 105 may apply a second number of decoding iterations to decoding the message after the first number of decoding iterations are applied. In some cases, all of the number of check nodes are decoded during each of the second number of decoding iterations. Additionally, the UE 115 or the base station 105 may decode the message through completion of both the first number of decoding iterations and the second number of decoding iterations.

Figure 2:
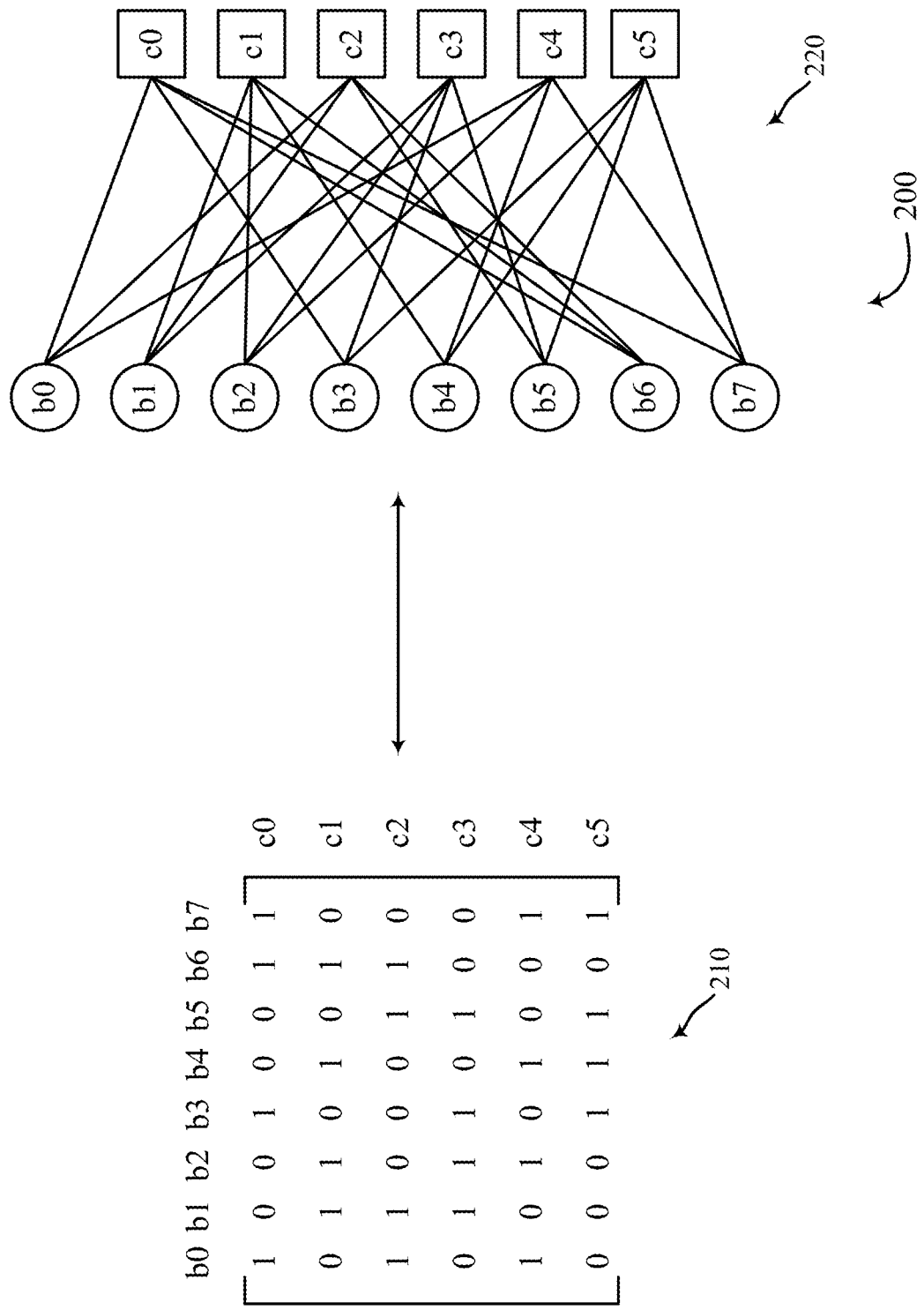
FIG. 2 illustrates an example of a diagram that supports scheduling for LDPC codes in accordance with aspects of the present disclosure.

FIG. 2 illustrates an example of a diagram 200 that supports scheduling for LDPC codes in accordance with various aspects of the present disclosure. In some examples, diagram 200 includes a sparse parity check matrix 210 and an associated bipartite graph 220. In some examples, the diagram 200 may implement aspects of wireless communication system 100.

In some implementations, the bipartite graph 220 may include bit nodes b0 through b7 and check nodes c0 through c5. Each bit node b0-b7 may represent a corresponding column in the parity check matrix 210, and each check node c0-c5 may represent a corresponding row in the parity check matrix 210. The example parity check matrix 210 is not an actual LDPC parity check matrix, and is provided for illustrative purposes only. In the example of FIG. 2, each "1" represents a bit involved in a parity check. Thus, for each received code word $a=[a_0, a_1, \ldots a_7]$, the parity checks may be based on:

$$a_0+a_3+a_6+a_7,$$

$$a_1+a_2+a_4+a_6,$$

and so on. In some examples, the received code word may be represented by soft information, the values of which may be used to initialize a matrix according to the parity check matrix 210 for iterative decoding. For example, if the soft information generated from a received code word is [0.22, 0.17, 0.78, 0.80, 0.87, 0.10, 0.25, 0.33], then an initialized matrix X according to the parity check matrix 810 would be:

$$\begin{bmatrix} 0.22 & & & 0.80 & & & 0.25 & 0.33 \\ & 0.17 & 0.78 & & 0.87 & & 0.25 & \\ 0.22 & 0.17 & & & & 0.10 & 0.25 & \\ & 0.17 & 0.78 & & & 0.10 & & \\ 0.22 & & 0.78 & 0.80 & 0.87 & & & 0.33 \\ & & & 0.80 & 0.87 & 0.10 & & 0.33 \end{bmatrix}$$

In some examples, each connection between a bit node and a check node is referred to as an edge, and corresponds to a "1" in the parity check matrix. Because the parity check matrix 210 has a column weight of 3 and a row weight of 4, each bit node is connected to three edges and each check node is connected to four edges. During the iterative decoding process, each check node may provide a bit node estimate to a bit node based on information from other related bit nodes. Each bit node, in return, may provide an estimate of its own value based on information from other related check nodes. The process may continue until all parity check equations are satisfied, indicating a valid decode, or until a maximum number of iterations is reached without satisfying all parity check equations, indicating a decoding failure. In some cases, the maximum number of iterations may be dynamically adjusted to control the rate at which a valid decode and a decoding failure are determined.

In some cases during decoding, a value may be assigned to each edge of the bipartite graph 220 that is representative of a channel value associated with a bit node to which the edge is connected. Check nodes may then be updated by accumulating the edge values according to a log-likelihood operation G:

$$G(a, b) = \ln \frac{1 + e^{a+b}}{e^a + e^b}$$

Bit nodes may thereafter be updated with the update edge values by summing the edge values associated with the bit node. Thereafter, the system determines if all parity equations are satisfied or if a maximum number of iterations has been reached if all parity equations are not satisfied.

The interconnection between the bit nodes and check nodes in an LDPC code is typically pseudo-random. To facilitate high-speed decoding with reasonable complexity, a structure is often imparted in the code design so that the connections to the check nodes for a group of bit nodes are a linear translation of each other, (e.g., some or all of the parity equations may be expressed as a linear combination or a linear translation of one particular parity equation). For example, a parity check matrix may define the following sets of linearly shifted parity check equations (1) and (2):

$a_0 + a_8 + a_{16} + a_{32} = 0,$ $a_1 + a_9 + a_{17} + a_{33} = 0,$ $a_2 + a_{10} + a_{18} + a_{34} = 0$      (1)

$a_0 + a_{10} + a_{20} + a_{30} = 0,$ $a_1 + a_{11} + a_{21} + a_{31} = 0,$ $a_2 + a_{12} + a_{22} + a_{32} = 0$      (2)

and so on. Thus, in the linearly shifted parity check equation (1), operands $a_0$, $a_1$ and $a_2$ correspond to the first operand $a_p$, operands $a_8$, $a_9$ and $a_{10}$ correspond to the second operand $a_{p+8}$, and so on.

Figure 3:
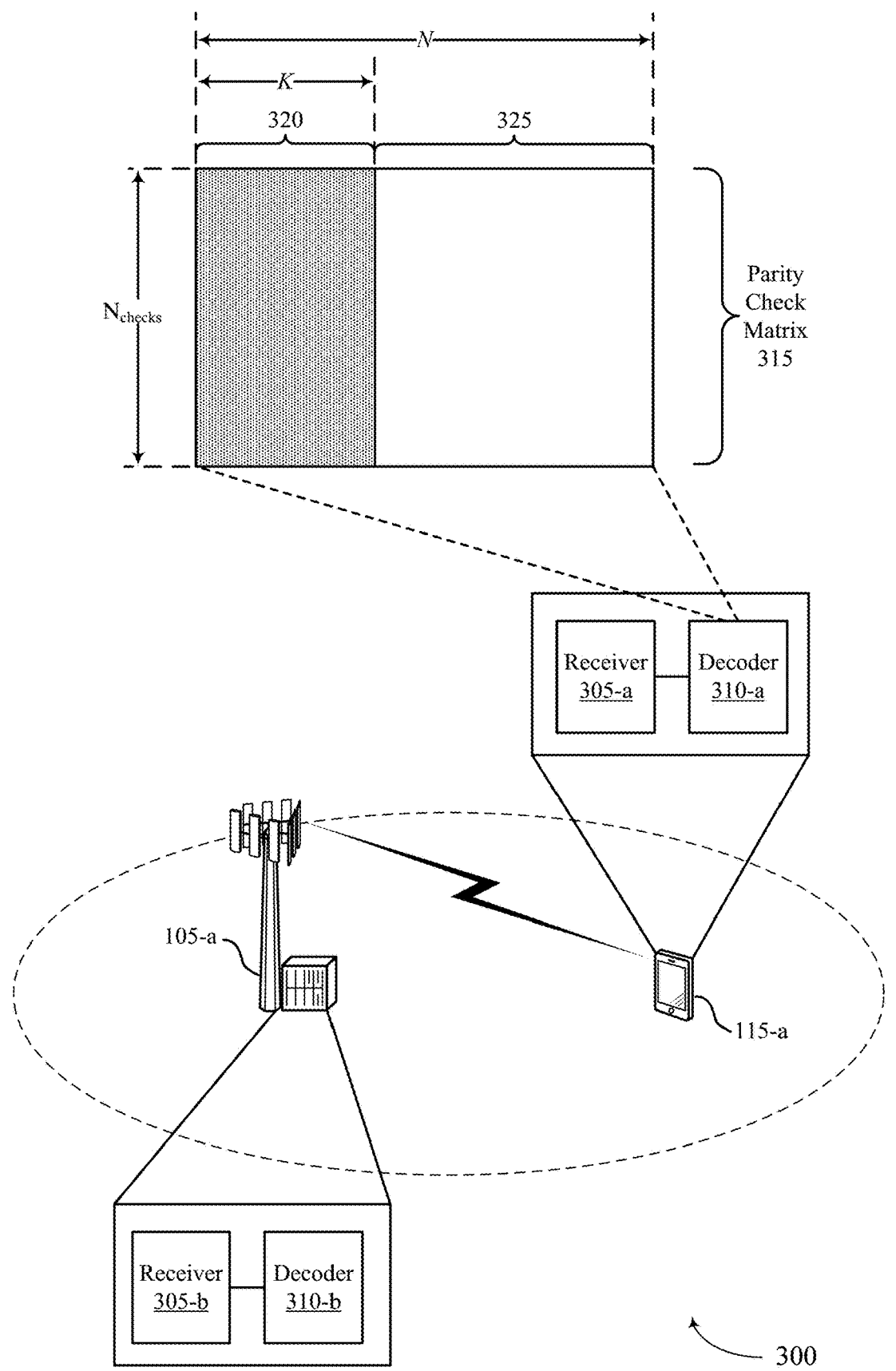
FIG. 3 illustrates an example of a wireless communications system that supports scheduling for LDPC codes in accordance with aspects of the present disclosure.

FIG. 3 illustrates an example of a wireless communications system 300 that supports scheduling for LDPC codes in accordance with various aspects of the present disclosure. In some examples, wireless communications system 300 may implement aspects of wireless communication system 100.

Wireless communications system 300 includes a base station 105-a and UE 115-a, which may be examples of the corresponding devices as described with reference to FIG. 1. Wireless communications system 300 may illustrate an example of wireless devices that support scheduling for LDPC codes according to predetermined scheduling order.

Base station 105-a and UE 115-a may be in communication with each other, and may encode uplink and/or downlink transmissions using LDPC coding at a transmitter to transmit to a receiver. Accordingly, one or both UE 115-a and base station 105-a may include a receiver 205 used to receive LDPC codewords from the transmitting device, and these LDPC codewords may in turn be decoded at a decoder 310 of the receiving device, whether UE 115-a or base station 105-a. For example, time-frequency resources over which an LDPC encoded signal are sent may be identified at receiver 305-a of UE 115-a. UE 115-a may demodulate the transmission over those time-frequency resources and, at decoder 310-a, decode the demodulated transmission to obtain information bits that indicate the downlink transmission. The processes described as being performed by receiver 305-a and decoder 310-a of UE 115-a may be similarly performed for uplink transmissions at base station 105-a (e.g., by receiver 305-b and decoder 310-b, respectively).

To decode received LDPC codewords according to techniques described in the present disclosure, decoder 310-a may use a parity check matrix 315, which may be a matrix having dimensions of $N_{checks}$ rows and N columns. In such cases, N may correspond to a length of an LDPC codeword and $N_{checks}$ may correspond to a number of check bits, or parity bits, used to decode a codeword. Parity check matrix 315 may include K systematic bits 320 (e.g., a sequence of information bits) and N–K parity bits 325.

In some cases, as previously discussed, the parity check matrix 315 may be representative of a base graph used for LDPC decoding, where the parity check matrix 315 may include a high-rate core graph in addition to a degree one extension (e.g., used for HARQ or incremental redundancy (IR)-HARQ). A degree of a check node in parity check matrix 315 may refer to the number of bit nodes (columns) attached to a check node (row) in parity check matrix 315. Thus, a degree one of a check node may correspond to a connection between the check node and one bit node. In some examples, certain columns within the parity check matrix 315 may include entries corresponding to nodes that have various degrees. In some examples, parity check matrix 315 may also include one or more punctured bit columns (e.g., corresponding to bits that are removed from the codeword).

Using an LDPC decoding algorithm, a decoder 310-a may receive a message encoded as an LDPC code that includes a number of check nodes and a number of bit nodes, apply a number of partial decoding iterations to decode the message, apply a number of full decoding iterations to decode the message after the partial decoding iterations are applied, and decode the message through completion of both partial decoding iterations and the full decoding iterations.

Figure 4:
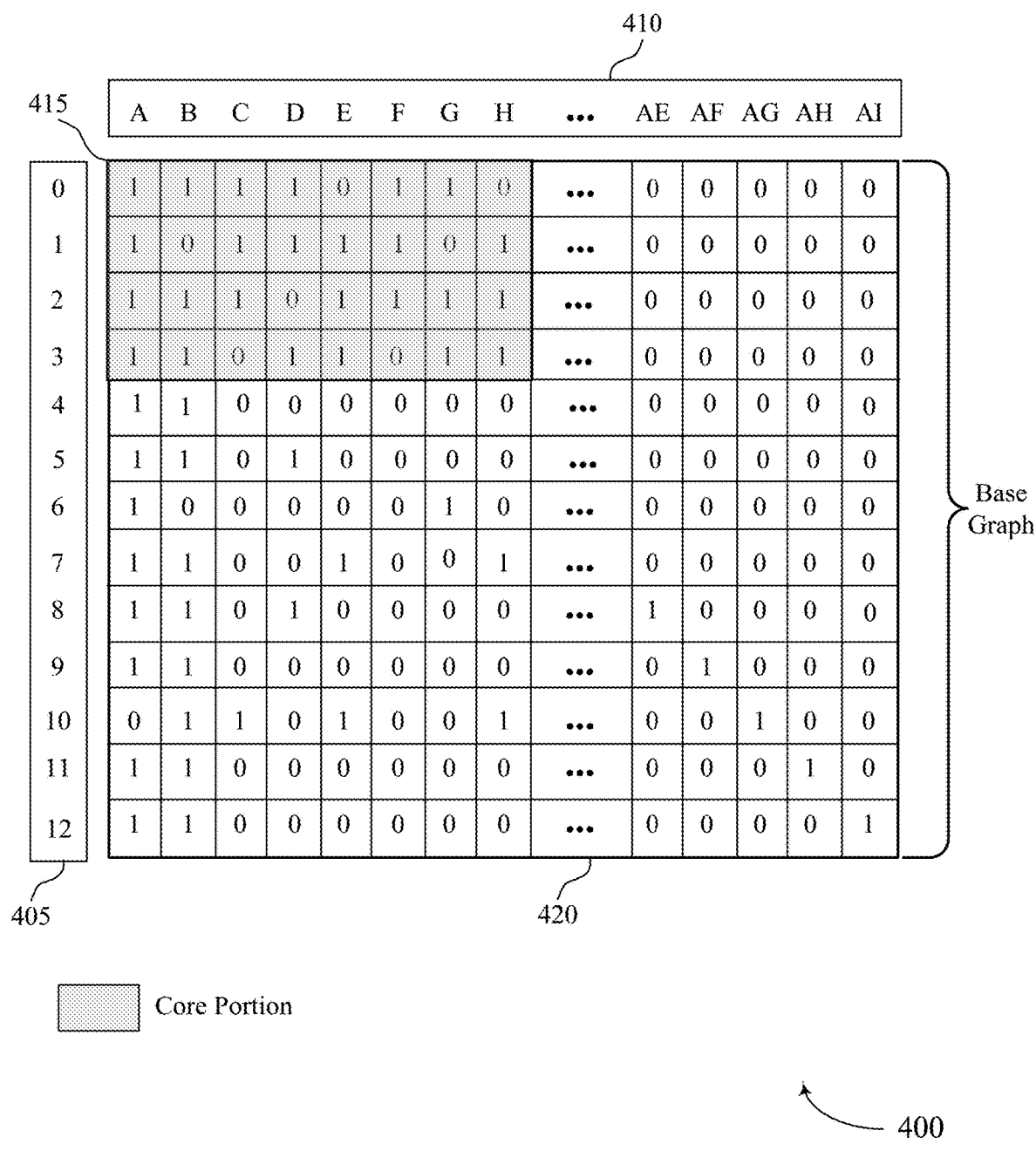
FIG. 4 illustrates an example of a diagram that supports scheduling for LDPC codes in accordance with aspects of the present disclosure.

FIG. 4 illustrates an example of a diagram 400 that supports scheduling for LDPC codes in accordance with various aspects of the present disclosure. In some examples, diagram 400 may include a base graph 420.

In some implementations, the base graph 420 may include bit nodes 410 A through AI and check nodes 405 0 through 12. As depicted in the example of FIG. 4, each bit node 410 represents a corresponding column in the base graph 420, and each check node 405 represents a corresponding row in the base graph 420. As previously discussed, the base graph 420 may be an example of a parity check matrix. The example base graph 420 is not an actual LDPC parity check matrix, and is provided for illustrative purposes only.

In some examples, each check node 405 may be connected to a set of bit nodes 410. For example, a message may be delivered using the set of bit nodes 410. In some cases, the message may include a code word as well as one or more parity bits to protect the message. In some examples, each "1" in the base graph 420 may represent a connection between a check node 405 and a bit node 410. Referring to FIG. 4, the check node "0" has connections with bit nodes 410 "A," "B," "C," "D," "F," and "G." Although not shown in FIG. 4, the base graph 420 may include more bit nodes 410. Similarly, the connections between the check node "0" and the bit nodes 410 may be different. In conventional techniques, a decoder may decode a base graph 420 from the first row to the last row. For example, a decoder may be configured to decode all columns associated with a first row. The decoder may then move on to decode all columns associated with a second row, and so on. With respect to the example of FIG. 4, a decoder may first decode all bit nodes 410 connected to the check node "0" during a first iteration. After the first iteration, the decoder may decode all bit nodes 410 connected to the check node "1." During the third iteration, the decoder may further decode all bit nodes 410 connected to the check node "2." Thus, conventional techniques allow a decoder to serially decode a base graph 420. However, this may lead to inefficient decoding. This is because a degree or number of degrees associated with each check node 405 may be different from one another.

In one example, a degree associated with a check node 405 may be determined based on a number of "1 s" associated with that check node 405. In the example of FIG. 4, the degree of check node "0" is greater than or equal to 6. That is, a minimum degree associated with the check node "0" is 6. Similarly, the degree of check node "1" is greater than or equal to 6, the degree of check node "2" is greater than or equal to 7, and the degree of check node "3" is greater than or equal to 6. Further, the degree of check node "4" is greater than or equal to 2, the degree of check node "5" is greater than or equal to 3, the degree of check node "6" is greater than or equal to 2, the degree of check node "7" is greater than or equal to 4, the degree of check node "8" is greater than or equal to 4, the degree of check node "9" is greater than or equal to 3, the degree of check node "10" is greater than or equal to 5, the degree of check node "11" is greater than or equal to 3, and the degree of check node "12" is greater than or equal to 3. In some examples, the degree associated with a check node 405 is greater than the previously calculated value, when a check node 405 is connected to more bit nodes 410 (not shown).

In some implementations, a first row of the base graph 420 may be denser than a second row of the base graph 420. For example, the first four rows of the base graph 420 may be considered as dense. As previously discussed, a degree associated with the check nodes "0," "1," "2," and "3" are 6, 6, 7, and 6 respectively. This means that the first four rows of the base graph 420 are denser than the remaining rows. In some examples, a denser portion of the base graph 420 may be referred to as a core portion 415. In some cases, an output of a check node 405 may depend on the least reliable message of one or more incoming messages. More specifically, if one message is erased from a stream of incoming messages associated with a check node 405, then the output from that check node 405 may not be reliable. As a result, if a check node 405 is connected to a higher number of bit nodes 410, then the output message from decoding that check node 405 may not be reliable. On the other hand, if a check node 405 is connected to one bit node 410, then the outgoing message associated with that check node 405 is correct if the message from one bit node 410 is correctly decoded. Thus, a check node 405 having a lower degree may have higher reliability than a check node 405 having a higher degree. In other words, a check node 405 connected to more bit nodes 410 may have lesser reliability than a check node 405 connected to lesser number of bit nodes 410. Under such circumstances, decoding using a natural order (e.g., decoding serially from row 0 to row 12), may result in inefficient decoding.

In some examples, the conventional techniques of decoding may result in updating a core portion of the base graph 420 during the first several iterations. Thus, there may be a need for decoding the base graph 420 according to a predetermined scheduling order. In some examples, the scheduling order may be based on a degree associated with a check node. In some cases, the base graph 420 may be more efficiently decoded by updating lower degree check nodes 405 (or, by check nodes belonging to a non-core portion of the base graph 420) prior to updating the remaining portion of the base graph 420. Further, the updated messaged from the non-core portion of the base graph 420 may be used to improve the reliability of updated the core portion 415 of the base graph 420. Thus, the method of partial decoding prior to decoding the entire base graph 420 may reduce the decoding complexity.

In some examples of LDPC codes, the first two bit nodes 410 may be punctured. In the example of FIG. 4, the bit node "A" and the bit node "B" may be punctured. Thus, a check node 405 connected to any one (or both) of the punctured bit nodes 410 may be less reliable than a check node 405 not connected to the punctured bit nodes 410. As depicted in FIG. 4, the check node "6" has one connection in the first two bit nodes 410. Further, check node "10" also has one connection in the first two bit nodes 410. Such check nodes 405 connected to one of the two punctured bits may be referred to as type 1 check nodes 405. Additionally, a check node 405 connected to both punctured bits may be referred to as a type 2 check node 405. In the example of FIG. 4, check node "4" has two connections in the first two bit nodes 410. More specifically, as depicted in the FIG. 4, the check node "4" is connected to the first bit node "A" and the second bit node "B." Thus, check nodes "6" and "10" in the example of FIG. 4 may be referred to as type 1 check node and check node "4" in the example of FIG. 4 may be referred to as a type 2 check node. In some examples, a scheduling order may be based on a type of a check node 405. In some cases, it is more efficient to update type 1 check nodes 405 prior to updating type 2 check nodes.

In some examples, a decoding scheme to decode the base graph 420 may include a partial decoding of check nodes 405 associated with a predetermined scheduling order. For example, a decoder may partially decode check nodes 405 associated with degrees less than a predefined threshold. In some cases, the decoder may perform a full decoding of all the check nodes 405 according to a predetermined scheduling order. In some cases, the predetermined scheduling order may be based on a degree of a check node 405. For example, the predetermined scheduling order may range from a lowest degree to a highest degree. That is, a check node 405 associated with the lowest degree may be updated first, followed by a check node 405 associated with the next lowest degree. In some other cases, the predetermined scheduling order may be based on a number of punctured bits that a check node 405 is connected to. As an example, a decoder may be configured to update type 1 check nodes 405 prior to updating type 2 check nodes. In further implementations, the predetermined scheduling order may be based on an EXIT chart optimization. In some cases, the EXIT chart optimization may be used to determine a check node 405 which minimizes bit error rate of the code. Thus, the decoding scheme described herein may result in performance enhancement while significantly saving on decoding complexity.

Figure 5:
FIG. 5 illustrates an example of a scheduling order that supports scheduling for LDPC codes in accordance with aspects of the present disclosure.

FIG. 5 illustrates an example of a scheduling order 500 that supports scheduling for LDPC codes in accordance with various aspects of the present disclosure. In some examples, scheduling order 500 may implement aspects of wireless communication system 100.

FIG. 5 describes a scheduling order 500 of check nodes of the base graph 420 (as described with reference to FIG. 4) according to conventional techniques. The conventional technique allows a decoder to serially decode the check nodes of a base graph. Referring back to FIG. 4, the base graph 420 may include bit nodes 410 A through AI and check nodes 405 0 through 12. As previously discussed, each check node 405 of the base graph 420 may be connected to a set of bit nodes 410. In the example of FIG. 4, each "1" in the base graph 420 represents a connection between a check node 405 and a bit node 410. According to FIG. 4, the check node "0" has connections with bit nodes 410 "A," "B," "C," "D," "F," and "G." Similarly, the check node "1" has connections with bit nodes 410 "A," "C," "D," "E," "F," and "H," the check node "2" has connections with bit nodes 410 "A," "B," "C," "E," "F," "G," and "H," the check node "3" has connections with bit nodes 410 "A," "B," "D," "E," "G," and "H," and so on.

As previously discussed, a degree associated with a check node is determined based on a number of "1s" associated with that check node. Referring to the base graph 420 of FIG. 4, the degree of check node "0" is 6, the degree of check node "1" is 6, the degree of check node "2" is 7, and the degree of check node "3" is 6. In some examples, the degree associated with a check node 405 may be greater than the previously calculated value in cases where a check node is connected to more bit nodes (more than the number of bit nodes shown in FIG. 4).

In the example of FIG. 5, during a first iteration, a decoder may decode a base graph from the first row to the last row. For example, a decoder may be configured to decode all columns associated with check node "0." Then the decoder may decode all columns associated with a check node "1." Similarly, as described in FIG. 5, using conventional techniques, the decoder may sequentially decode check node "2," check node "3," check node "4," check node "5," check node "6," check node "7," check node "8," check node "9," check node "10," check node "11," and check node "12." Thus, conventional techniques allow a decoder to serially decode all check nodes of a base graph (such as base graph 420 of FIG. 4). However, as previously discussed, this may lead to inefficient decoding, as a first row of a base graph may be denser than a second row of the base graph. With reference to FIG. 4, a first row associated with check node 0, a second row associated with check node 1, a third row associated with check node 2, and a fourth row associated with check node 3, may be denser than the remaining rows of the base graph 420. In some examples, a check node connected to more bit nodes may have lesser reliability than a check node connected to lesser number of bit nodes. Thus, decoding using conventional techniques as described with reference to FIG. 5 (i.e., decoding serially from check node 0 to check node 12), may result in inefficient decoding.

The scheduling order 500 is provided as an example based on the example base graph 420 of FIG. 4.

FIG. 6 illustrates an example of a scheduling order 600 that supports scheduling for LDPC codes in accordance with various aspects of the present disclosure. In some examples, scheduling order 600 may implement aspects of wireless communication system 100.

FIG. 6 describes a scheduling order 600 of check nodes of the base graph 420 (as described with reference to FIG. 4) according to techniques described in the present disclosure. The decoding scheme described in the present disclosure allows a decoder to decode a base graph by partial decoding of check nodes using a predetermined scheduling order. Then, the decoder may perform a full decoding of all the check nodes according to a predetermined scheduling order.

Referring back to FIG. 4, the base graph 420 may include bit nodes 410 A through AI and check nodes 405 0 through 12. As previously discussed, each check node 405 of the base graph 420 may be connected to a set of bit nodes 410. In the example of FIG. 4, each "1" in the base graph 420 represents a connection between a check node 405 and a bit node 410. According to FIG. 4, the check node "0" has connections with bit nodes 410 "A," "B," "C," "D," "F," and "G." Similarly, the check node "1" has connections with bit nodes 410 "A," "C," "D," "E," "F," and "H," the check node "2" has connections with bit nodes 410 "A," "B," "C," "E," "F," "G," and "H," the check node "3" has connections with bit nodes 410 "A," "B," "D," "E," "G," and "H," and so on.

Further, in the example of FIG. 4, the bit node "A" and the bit node "B" are punctured. In some embodiments, a check node connected to any one of the punctured bit nodes or both of the punctured bit nodes may be less reliable than a check node not connected to the punctured bit nodes. In some implementations, check nodes connected to one of the two punctured bits may be referred to as type 1 check nodes. Additionally, check nodes connected to both punctured bits may be referred to as type 2 check nodes. Referring to FIG. 4, the check node "6" has a connection with the bit node "A" and does not have a connection with the bit node "B." Additionally, check node "10" has a connection with the bit node "B" but does not have a connection with bit node "A." Thus, the check node "6" and the check node "10" each have one connection with a punctured bit node and may be referred to as type 1 check nodes. Further, the check node "4" has two connections in the first two bit nodes 410. More specifically, as depicted in the FIG. 4, the check node "4" is connected to the first bit node "A" and the second bit node "B." Thus, check node "4" may be referred to as a type 2 check node.

Referring back to FIG. 6, a scheduling order may be based on a type of a check node. In some cases, the scheduling order may also be based on a degree of a check node. For example, check node may be updated according to an ascending degree associated with the check node. In some other cases, the scheduling order may configure a decoder to update type 1 check nodes prior to updating type 2 check nodes. In some alternative cases, the order may configure a decoder to update type 2 check nodes prior to updating type 1 check nodes. In further implementations, the scheduling order may be based on an EXIT chart optimization.

Referring to the base graph 420 of FIG. 4, the degree of check node "0" is 6, the degree of check node "1" is 6, the degree of check node "2" is 7, the degree of check node "3" is 6, the degree of check node "4" is 2, the degree of check node "5" is 3, the degree of check node "6" is 2, the degree of check node "7" is 4, the degree of check node "8" is 4, the degree of check node "9" is 3, the degree of check node "10" is 5, the degree of check node "11" is 3, and the degree of check node "12" is 3. In some examples, the degree associated with a check node may be greater than the previously calculated value when a check node is connected to more bit nodes (e.g., more than the number of bit nodes shown in FIG. 4).

In the example of FIG. 6, during a first iteration 615, a decoder may begin decoding a base graph from check node "4." For example, a decoder may decode check node "4,"

followed by check node "6," check node "7," check node "10," and check node "12." After completing updating check node 12, the decoder may advance to the second iteration 620. More specifically, as described in the scheduling order of FIG. 6, "−1" indicates the decoder did not update any check node during that instance. For example, the decoder may perform a partial decoding during the first iteration 615. Similarly, during the second iteration 620, the decoder may decode check node "4," followed by check node "6," check node "7," check node "10," and check node "12." After completing updating check node 12, the decoder may advance to the third iteration 625. As described in the example of FIG. 6, the first iteration 615, the second iteration 620, the third iteration 625, and the fourth iteration 630 are partial iterations. The decoder may use values of the updated check nodes from one iteration during a following iteration.

Further, during a fifth iteration 635, a decoder may update check node "4," followed by check node "7," check node "10," check node "12," check node "5," check node "11," check node "0," check node "1," check node "2," and check node "3." After completing updating check node "3," the decoder may advance to the sixth iteration 640. Further, during the sixth iteration 640, the decoder may update check node "4," followed by check node "7," check node "10," check node "12," check node "5," check node "11," check node "0," check node "1," check node "2," and check node "3." After completing updating check node 3, the decoder may advance to the seventh iteration 645. As described in the example of FIG. 6, the fifth iteration 635, the sixth iteration 640, the seventh iteration 645, the eighth iteration 650, the ninth iteration 655, the tenth iteration 660, the eleventh iteration 665, and the twelfth iteration 670 are full iterations. As described in the example of FIG. 6, the decoder is configured to update type 2 check nodes prior to updating type 1 check nodes. For example, in FIG. 6, the decoder updates check node "4" prior to updating check node "6" and check node "10."

The scheduling order 600 is provided as an example based on the example base graph 420 of FIG. 4.

FIG. 7 illustrates an example of a scheduling order 700 that supports scheduling for LDPC codes in accordance with various aspects of the present disclosure. In some examples, scheduling order 700 may implement aspects of wireless communication system 100.

FIG. 7 describes a scheduling order 700 of check nodes of the base graph 420 (as described with reference to FIG. 4) according to techniques described in the present disclosure. The decoding scheme described in the present disclosure allows a decoder to decode a base graph by partial decoding of check nodes using a predetermined scheduling order. Then, the decoder may perform a full decoding of all the check nodes according to a predetermined scheduling order.

As previously described with reference to FIGS. 4 through 6, the base graph 420 may include bit nodes 410 A through AI and check nodes 405 0 through 12. Each check node 405 of the base graph 420 may be connected to a set of bit nodes 410. In the example of FIG. 4, each "1" in the base graph 420 represents a connection between a check node 405 and a bit node 410. Further, in the example of FIG. 4, the bit node "A" and the bit node "B" are punctured. As previously discussed, check nodes connected to one of the two punctured bits may be referred to as type 1 check nodes, and check nodes connected to both punctured bits may be referred to as type 2 check nodes. Referring FIG. 4, the check node "6" has a connection with the bit node "A" and does not have a connection with the bit node "B." Additionally, check node "10" has a connection with the bit nodes "B" but does not have a connection with bit node "A." Thus, the check node "6" and the check node "10" each have one connection with a punctured bit node and may be referred to as type 1 check nodes. Further, the check node "4" has two connections in the first two bit nodes 410. More specifically, as depicted in the FIG. 4, the check node "4" is connected to the first bit node "A" and the second bit node "B." Thus, check node "4" may be referred to as a type 2 check node.

Referring back to FIG. 7, the scheduling order for updating one or more check nodes is based on a type of a check node. In some cases, the scheduling order may also be based on a degree of a check node. In some cases, the degree of a check node may be based on a number of bit nodes it is connected to. As discussed with reference to FIGS. 4 through 6, the degree of check node "0" is 6, the degree of check node "1" is 6, the degree of check node "2" is 7, the degree of check node "3" is 6, the degree of check node "4" is 2, the degree of check node "5" is 3, the degree of check node "6" is 2, the degree of check node "7" is 4, the degree of check node "8" is 4, the degree of check node "9" is 3, the degree of check node "10" is 5, the degree of check node "11" is 3, and the degree of check node "12" is 3. In some examples, the degree associated with a check node may be greater than the previously calculated value, when a check node is connected to more bit nodes (more than the number of bit nodes shown in FIG. 4). In some cases, a check node may be updated according to an ascending degree associated with the check node. In some other cases, the scheduling order may configure a decoder to update type 1 check nodes prior to updating type 2 check nodes. In some cases, the scheduling order may be based on an EXIT chart optimization.

In the example of FIG. 7, during a first iteration 715, a decoder may begin decoding a base graph from check node "10." For example, a decoder may decode check node "10," followed by check node "6," check node "4," check node "7," and check node "12." After completing updating check node 12, the decoder may advance to the second iteration 720. In some cases, "−1" as described in the scheduling order of FIG. 7, may indicate that there are no more check nodes available for the decoder to update. For example, the decoder may perform a partial decoding during the first iteration 715. Similarly, during the second iteration 720, the decoder may decode check node "10," followed by check node "6," check node "4," check node "7," and check node "12." After completing updating check node "12," the decoder may advance to the third iteration 725. As described in the example of FIG. 7, the first iteration 715, the second iteration 720, the third iteration 725, and the fourth iteration 730 are partial iterations. The decoder may be configured to use values the updated check nodes from one iteration during a following iteration.

Further, during a fifth iteration 735, the decoder may update check node "10," followed by check node "6," check node "4," check node "7," check node "12," check node "5," check node "0," check node "1," check node "2," and check node "3." After completing updating check node "3," the decoder may advance to the sixth iteration 740. As described in the example of FIG. 7 during the sixth iteration 740, the decoder may update check node "10," followed by check node "6," check node "4," check node "7," check node "12," check node "5," check node "0," check node "1," check node "2," and check node "3." After completing updating check node 3, the decoder may advance to the seventh iteration 745. As described in the example of FIG. 7, the fifth iteration 735, the sixth iteration 740, the seventh iteration 745, the eighth iteration 750, the ninth iteration 755, the tenth iteration 760, the eleventh iteration 765, and the twelfth iteration 770 are full iterations. As described in the example of FIG. 7, the decoder may update type 1 check nodes prior to updating type 2 check nodes. For example, in FIG. 7, the decoder may update check node "6" and check node "10" prior to updating check node "4."

The scheduling order 700 is provided as an example based on the example base graph 420 of FIG. 4.

Figure 8:
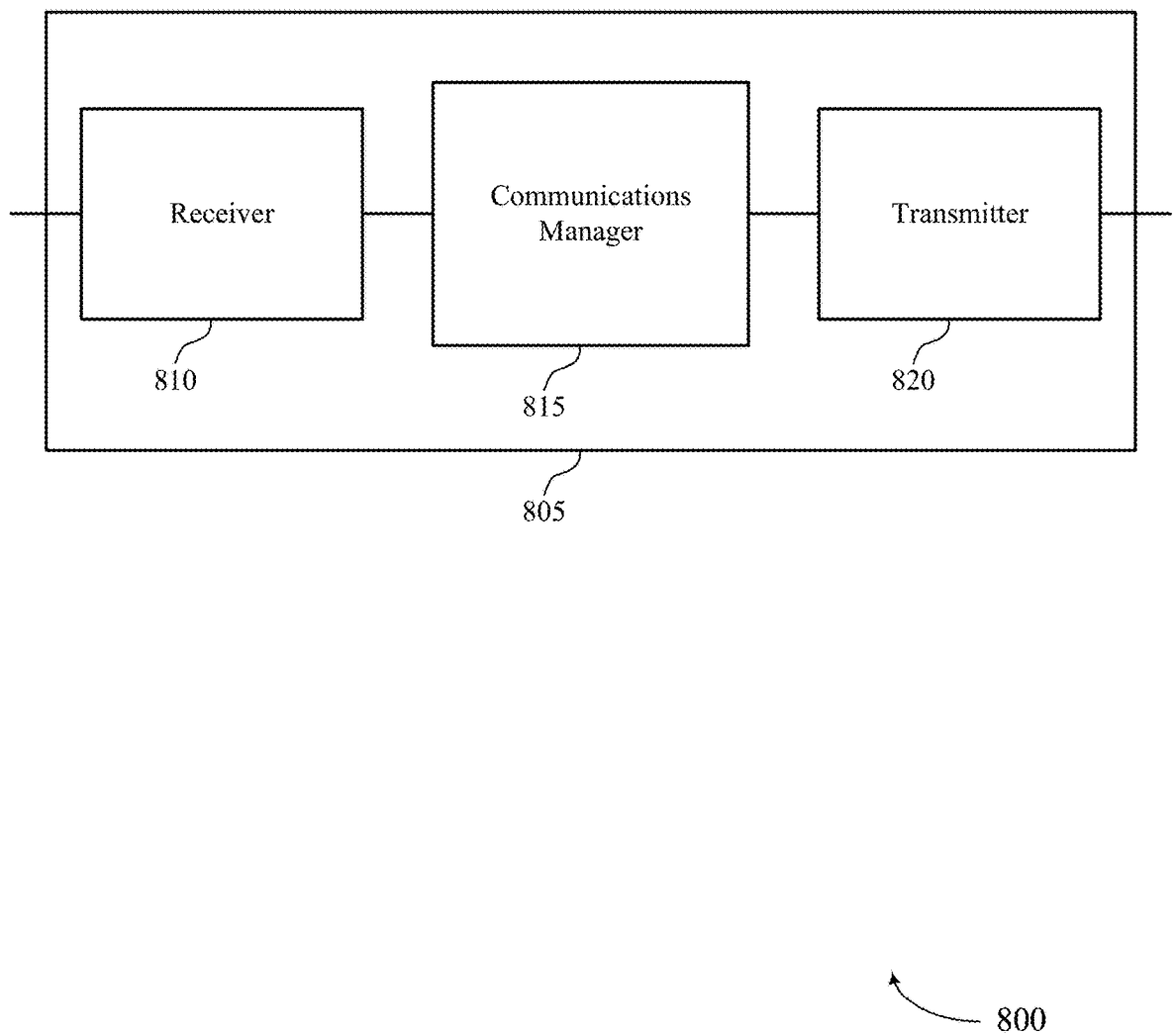
FIGS. 8 through 10 show block diagrams of a device that supports scheduling for LDPC codes in accordance with aspects of the present disclosure.

FIG. 8 shows a block diagram 800 of a wireless device 805 that supports scheduling for LDPC codes in accordance with aspects of the present disclosure. Wireless device 805 may be an example of aspects of a user equipment (UE) 115 or base station 105 as described herein. Wireless device 805 may include receiver 810, communications manager 815, and transmitter 820. Wireless device 805 may also include a processor. Each of these components may be in communication with one another (e.g., via one or more buses).

Receiver 810 may receive information such as packets, user data, or control information associated with various information channels (e.g., control channels, data channels, and information related to scheduling for LDPC codes, etc.). Information may be passed on to other components of the device. The receiver 810 may be an example of aspects of the transceiver 1135 described with reference to FIG. 11. The receiver 810 may utilize a single antenna or a set of antennas. Receiver 810 may receive a message encoded as an LDPC code that includes a set of check nodes and a set of bit nodes.

Communications manager 815 may be an example of aspects of the communications manager 1115 described with reference to FIG. 11. Communications manager 815 and/or at least some of its various sub-components may be implemented in hardware, software executed by a processor, firmware, or any combination thereof. If implemented in software executed by a processor, the functions of the communications manager 815 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The communications manager 815 and/or at least some of its various sub-components may be physically located at various positions, including being distributed such that portions of functions are implemented at different physical locations by one or more physical devices. In some examples, communications manager 815 and/or at least some of its various sub-components may be a separate and distinct component in accordance with various aspects of the present disclosure. In other examples, communications manager 815 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Communications manager 815 may apply a first number of decoding iterations to decoding the message, where only a portion of the set of check nodes is decoded during each of the first number of decoding iterations. Communications manager 815 may further apply a second number of decoding iterations to decoding the message after the first number of decoding iterations are applied, where all of the set of check nodes are decoded during each of the second number of decoding iterations. Communications manager 815 may then decode the message through completion of both the first number of decoding iterations and the second number of decoding iterations.

Transmitter 820 may transmit signals generated by other components of the device. In some examples, the transmitter 820 may be collocated with a receiver 810 in a transceiver module. For example, the transmitter 820 may be an example of aspects of the transceiver 1135 described with reference to FIG. 11. The transmitter 820 may utilize a single antenna or a set of antennas.

Figure 9:
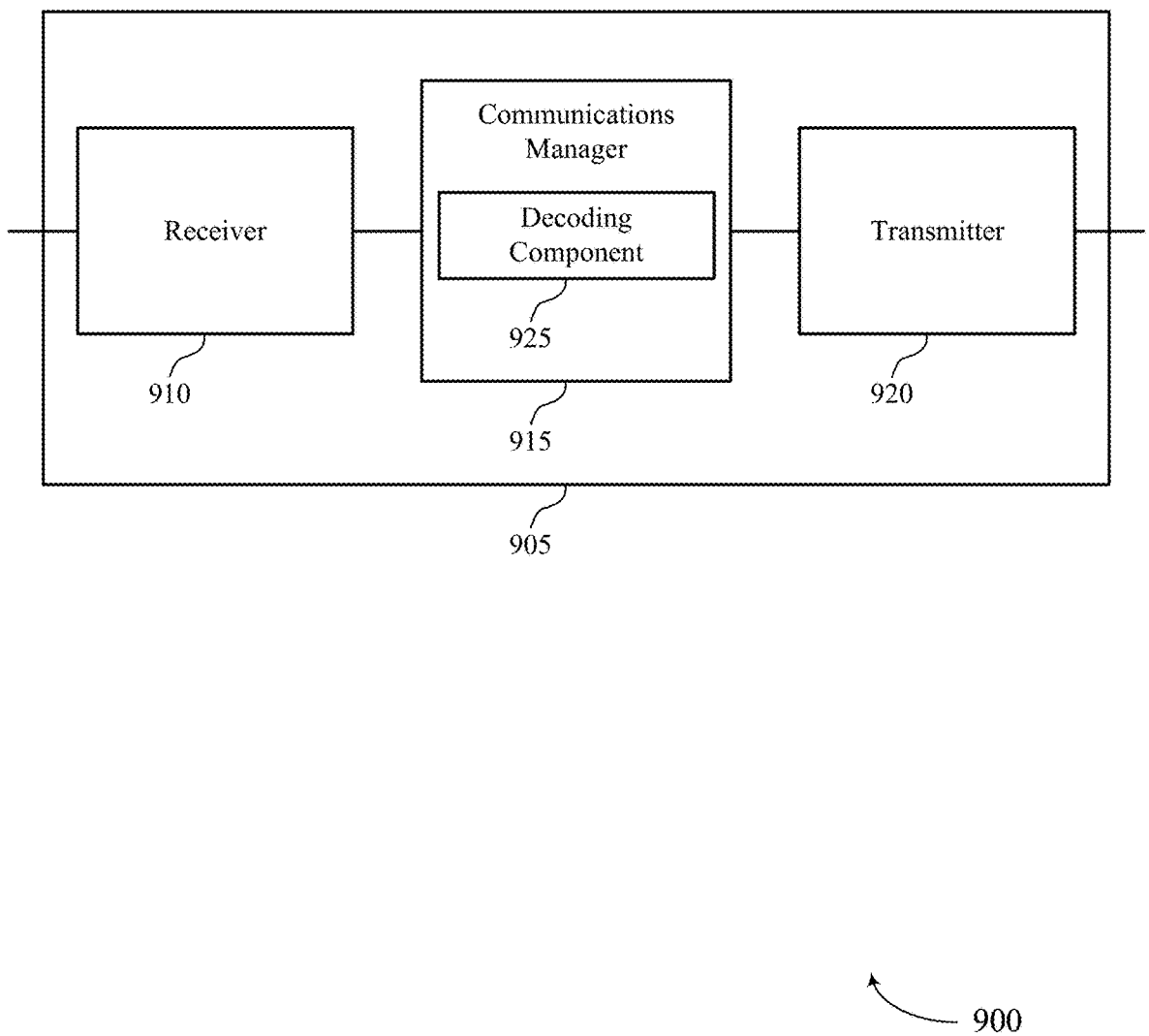

FIG. 9 shows a block diagram 900 of a wireless device 905 that supports scheduling for LDPC codes in accordance with aspects of the present disclosure. Wireless device 905 may be an example of aspects of a wireless device 805 or a UE 115 or base station 105 as described with reference to FIG. 8. Wireless device 905 may include receiver 910, communications manager 915, and transmitter 920. Wireless device 905 may also include a processor. Each of these components may be in communication with one another (e.g., via one or more buses).

Receiver 910 may receive information such as packets, user data, or control information associated with various information channels (e.g., control channels, data channels, and information related to scheduling for LDPC codes, etc.). Information may be passed on to other components of the device. The receiver 910 may be an example of aspects of the transceiver 1135 described with reference to FIG. 11. The receiver 910 may utilize a single antenna or a set of antennas.

Communications manager 915 may be an example of aspects of the communications manager 1115 described with reference to FIG. 11. Communications manager 915 may also include decoding component 925.

Decoding component 925 may apply a first number of decoding iterations to decoding the message, where only a portion of the set of check nodes is decoded during each of the first number of decoding iterations. Decoding component 925 may also apply a second number of decoding iterations to decoding the message after the first number of decoding iterations are applied, where all of the set of check nodes are decoded during each of the second number of decoding iterations. The message may be decoded through completion of both the first number of decoding iterations and the second number of decoding iterations.

Transmitter 920 may transmit signals generated by other components of the device. In some examples, the transmitter 920 may be collocated with a receiver 910 in a transceiver module. For example, the transmitter 920 may be an example of aspects of the transceiver 1135 described with reference to FIG. 11. The transmitter 920 may utilize a single antenna or a set of antennas.

Figure 10:
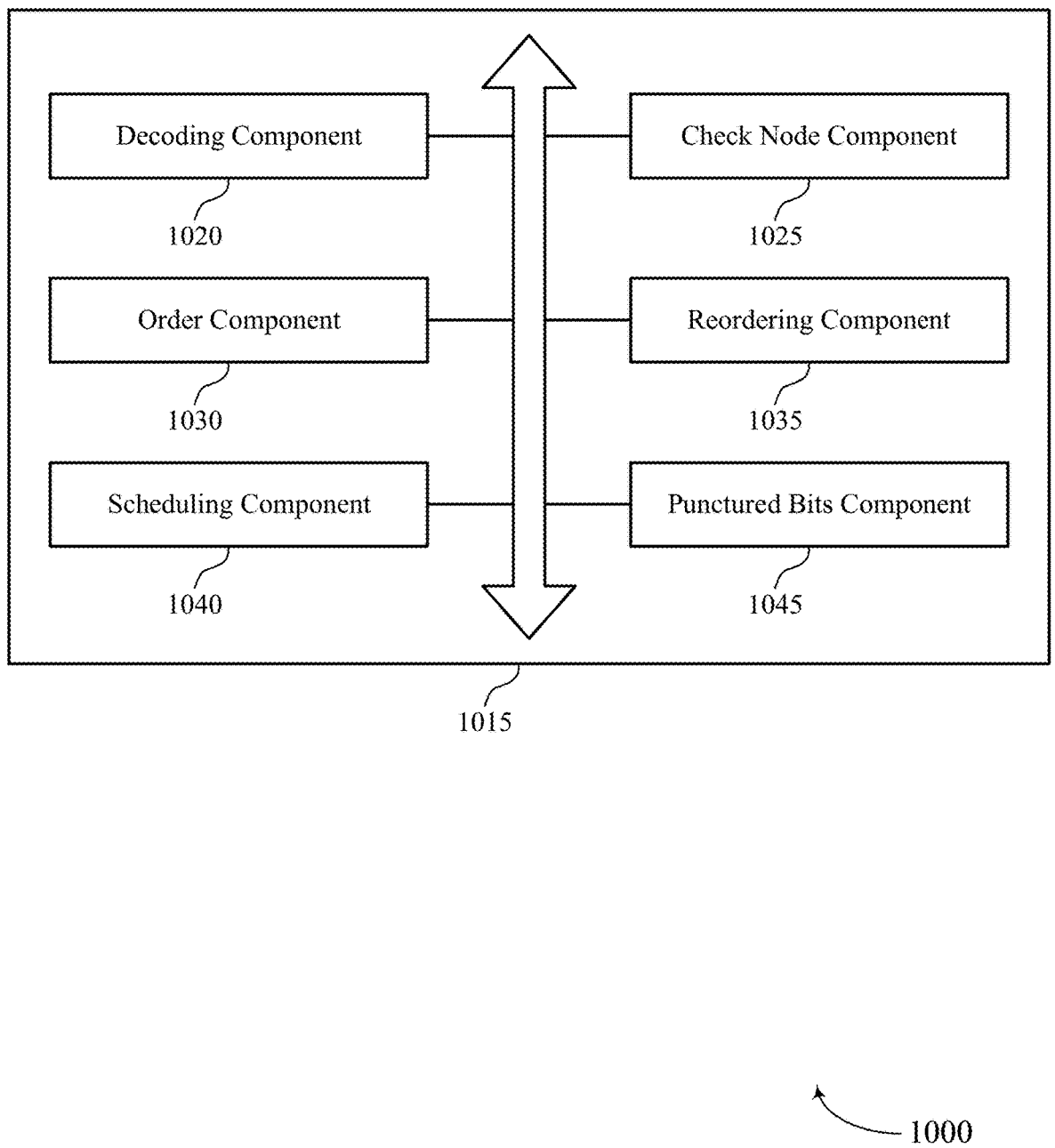

FIG. 10 shows a block diagram 1000 of a communications manager 1015 that supports scheduling for LDPC codes in accordance with aspects of the present disclosure. The communications manager 1015 may be an example of aspects of a communications manager 815, a communications manager 915, or a communications manager 1115 described with reference to FIGS. 8, 9, and 11. The communications manager 1015 may include decoding component 1020, check node component 1025, order component 1030, reordering component 1035, scheduling component 1040, and punctured bits component 1045. Each of these modules may communicate, directly or indirectly, with one another (e.g., via one or more buses).

Decoding component 1020 may apply a first number of decoding iterations to decoding the message, where only a portion of the set of check nodes is decoded during each of the first number of decoding iterations. Decoding component 1020 may also apply a second number of decoding iterations to decoding the message after the first number of decoding iterations are applied, where all of the set of check nodes are decoded during each of the second number of decoding iterations. The message may be decoded through completion of both the first number of decoding iterations and the second number of decoding iterations.

Check node component 1025 may identify the portion of the set of check nodes as low-degree check nodes having a degree that is less than a threshold.

Order component 1030 may identify an order for decoding the portion of the set of check nodes during the first number of decoding iterations, where the first number of decoding iterations are applied according to the identified order. Order component 1030 may also identify an order for decoding all of the set of check nodes during the second number of decoding iterations, where the second number of decoding iterations are applied according to the identified order.

Reordering component 1035 may reorder the set of check nodes for decoding during one or both of the first number of decoding iterations and the second number of decoding iterations based on a scheduling configuration. Reordering component 1035 may also reorder the set of check nodes for decoding during one or both of the first number of decoding iterations and the second number of decoding iterations based on a degree of each of the set of check nodes. Further, reordering component 1035 may reorder the set of check nodes for decoding during one or both of the first number of decoding iterations and the second number of decoding iterations based on the number of punctured bits connected to each of the set of check nodes. Additionally, reordering component 1035 may reorder the set of check nodes for decoding during one or both of the first number of decoding iterations and the second number of decoding iterations based on an EXIT chart optimization.

Scheduling component 1040 may identify the scheduling configuration based on a rate of the LDPC code and select the scheduling configuration from a set of scheduling configurations which vary uniformly from supporting a high rate of the LDPC code to a low rate of the LDPC code.

Punctured bits component 1045 may determine a number of punctured bits connected to each of the set of check nodes. In some cases, the number of punctured bits is limited to a number of punctured bits within a range of the set of bit nodes. In some cases, the number of punctured bits is limited to the number of punctured bits within a first bit node and a second bit node of the set of bit nodes, where a number of bits in each bit node is based on a lifting size of the LDPC code.

Figure 11:
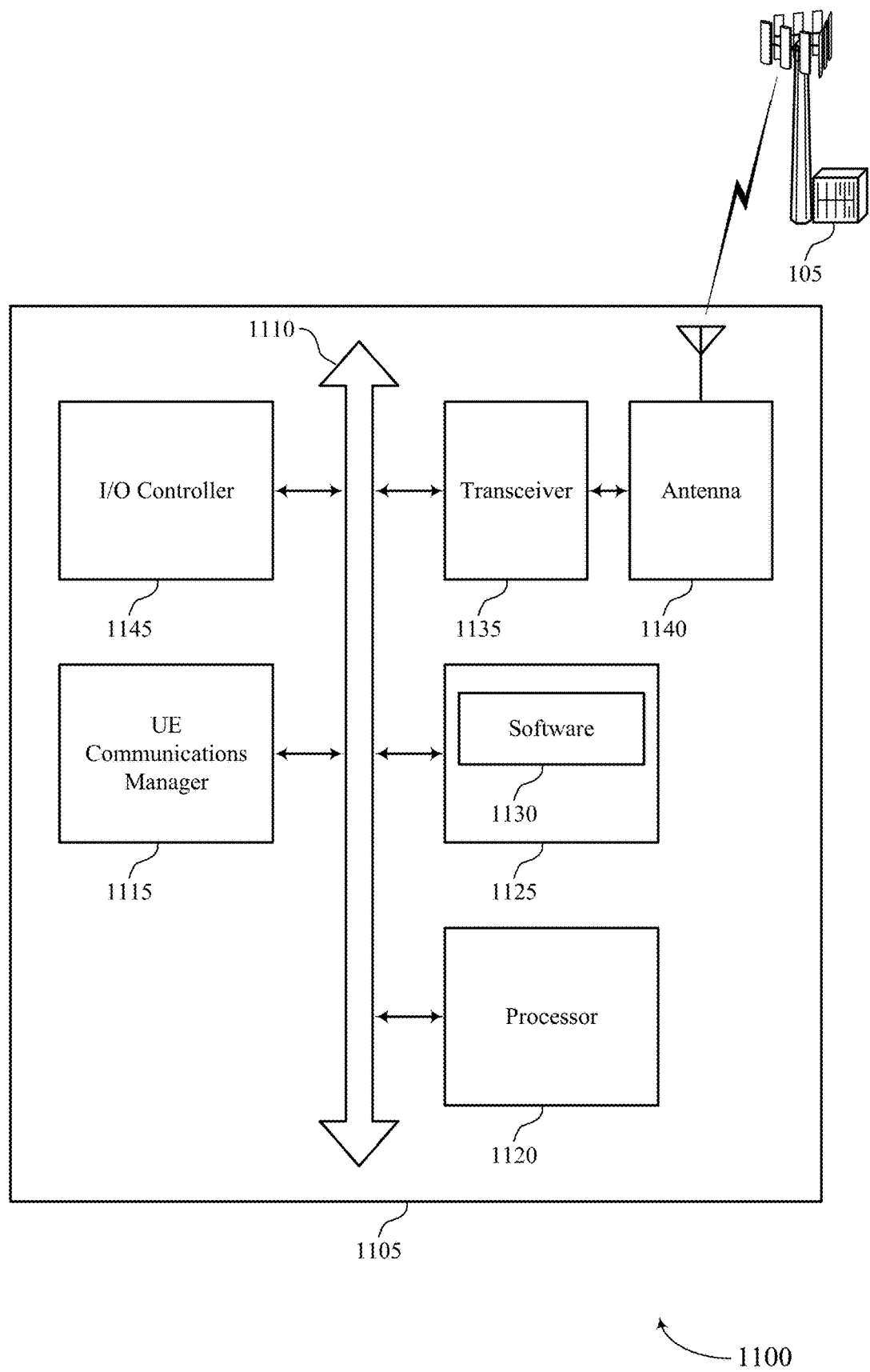
FIG. 11 illustrates a block diagram of a system including a user equipment (UE) that supports scheduling for LDPC codes in accordance with aspects of the present disclosure.

FIG. 11 shows a diagram of a system 1100 including a device 1105 that supports scheduling for LDPC codes in accordance with aspects of the present disclosure. Device 1105 may be an example of or include the components of wireless device 805, wireless device 905, or a UE 115 as described herein, e.g., with reference to FIGS. 8 and 9. Device 1105 may include components for bi-directional voice and data communications including components for transmitting and receiving communications, including UE communications manager 1115, processor 1120, memory 1125, software 1130, transceiver 1135, antenna 1140, and I/O controller 1145. These components may be coupled with one or more buses (e.g., bus 1110). Device 1105 may communicate wirelessly with one or more base stations 105.

Processor 1120 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1120 may be configured to operate a memory array using a memory controller. In other cases, a memory controller may be integrated into processor 1120. Processor 1120 may be configured to execute computer-readable instructions stored in a memory to perform various functions (e.g., functions or tasks supporting scheduling for LDPC codes).

Memory 1125 may include random-access memory (RAM) and read-only memory (ROM). The memory 1125 may store computer-readable, computer-executable software 1130 including instructions that, when executed, cause the processor to perform various functions described herein. In some cases, the memory 1125 may contain, among other things, a basic input/output system (BIOS) which may control basic hardware or software operation such as the interaction with peripheral components or devices.

Software 1130 may include code to implement aspects of the present disclosure, including code to support scheduling for LDPC codes. Software 1130 may be stored in a non-transitory computer-readable medium such as system memory or other memory. In some cases, the software 1130 may not be directly executable by the processor but may cause a computer (e.g., when compiled and executed) to perform functions described herein.

Transceiver 1135 may communicate bi-directionally, via one or more antennas, wired, or wireless links as described herein. For example, the transceiver 1135 may represent a wireless transceiver and may communicate bi-directionally with another wireless transceiver. The transceiver 1135 may also include a modem to modulate the packets and provide the modulated packets to the antennas for transmission, and to demodulate packets received from the antennas.

In some cases, the wireless device may include a single antenna 1140. However, in some cases the device may have more than one antenna 1140, which may be capable of concurrently transmitting or receiving multiple wireless transmissions.

I/O controller 1145 may manage input and output signals for device 1105. I/O controller 1145 may also manage peripherals not integrated into device 1105. In some cases, I/O controller 1145 may represent a physical connection or port to an external peripheral. In some cases, I/O controller 1145 may utilize an operating system such as iOS®, ANDROID®, MS-DOS®, MS-WINDOWS®, OS/2®, UNIX®, LINUX®, or another known operating system. In other cases, I/O controller 1145 may represent or interact with a modem, a keyboard, a mouse, a touchscreen, or a similar device. In some cases, I/O controller 1145 may be implemented as part of a processor. In some cases, a user may interact with device 1105 via I/O controller 1145 or via hardware components controlled by I/O controller 1145.

Figure 12:
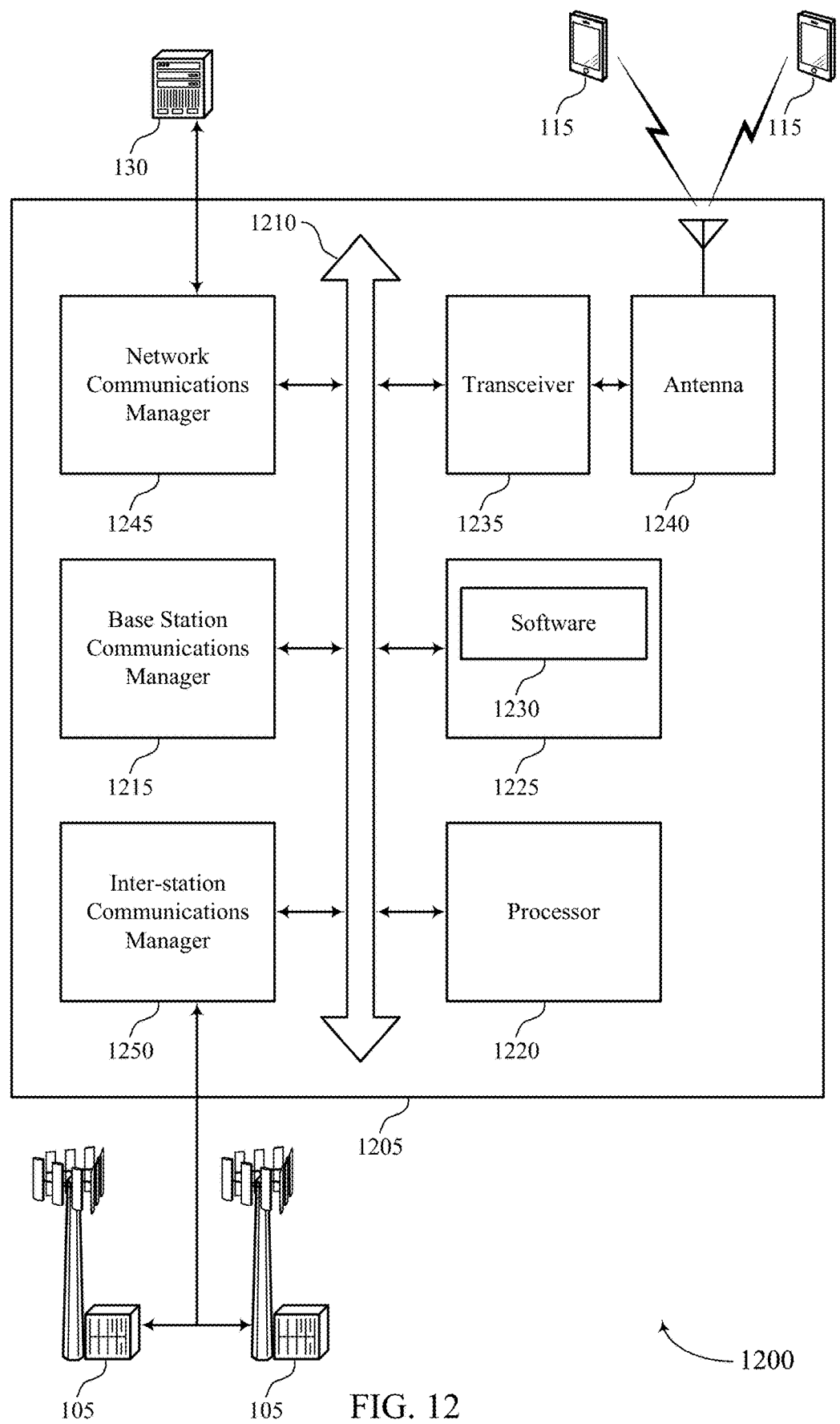
FIG. 12 illustrates a block diagram of a system including a base station that supports scheduling for LDPC codes in accordance with aspects of the present disclosure.

FIG. 12 shows a diagram of a system 1200 including a device 1205 that supports scheduling for LDPC codes in accordance with aspects of the present disclosure. Device 1205 may be an example of or include the components of wireless device 905, wireless device 1005, or a base station 105 as described herein, e.g., with reference to FIGS. 9 and 10. Device 1205 may include components for bi-directional voice and data communications including components for transmitting and receiving communications, including base station communications manager 1215, processor 1220, memory 1225, software 1230, transceiver 1235, antenna 1240, network communications manager 1245, and inter-station communications manager 1250. These components may be coupled with one or more buses (e.g., bus 1210). Device 1205 may communicate wirelessly with one or more UEs 115.

Processor 1220 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1220 may be configured to operate a memory array using a memory controller. In other cases, a memory controller may be integrated into processor 1220. Processor 1220 may be configured to execute computer-readable instructions stored in a memory to perform various functions (e.g., functions or tasks supporting scheduling for LDPC codes).

Memory 1225 may include RAM and ROM. The memory 1225 may store computer-readable, computer-executable software 1230 including instructions that, when executed, cause the processor to perform various functions described herein. In some cases, the memory 1225 may contain, among other things, a BIOS which may control basic hardware or software operation such as the interaction with peripheral components or devices.

Software 1230 may include code to implement aspects of the present disclosure, including code to support scheduling for LDPC codes. Software 1230 may be stored in a non-transitory computer-readable medium such as system memory or other memory. In some cases, the software 1230 may not be directly executable by the processor but may cause a computer (e.g., when compiled and executed) to perform functions described herein.

Transceiver 1235 may communicate bi-directionally, via one or more antennas, wired, or wireless links as described herein. For example, the transceiver 1235 may represent a wireless transceiver and may communicate bi-directionally with another wireless transceiver. The transceiver 1235 may also include a modem to modulate the packets and provide the modulated packets to the antennas for transmission, and to demodulate packets received from the antennas.

In some cases, the wireless device may include a single antenna 1240. However, in some cases the device may have more than one antenna 1240, which may be capable of concurrently transmitting or receiving multiple wireless transmissions.

Network communications manager 1245 may manage communications with the core network (e.g., via one or more wired backhaul links). For example, the network communications manager 1245 may manage the transfer of data communications for client devices, such as one or more UEs 115.

Inter-station communications manager 1250 may manage communications with other base station 105, and may include a controller or scheduler for controlling communications with UEs 115 in cooperation with other base stations 105. For example, the inter-station communications manager 1250 may coordinate scheduling for transmissions to UEs 115 for various interference mitigation techniques such as beamforming or joint transmission. In some examples, inter-station communications manager 1250 may provide an X2 interface within an Long Term Evolution (LTE)/LTE-A wireless communication network technology to provide communication between base stations 105.

Figure 13:
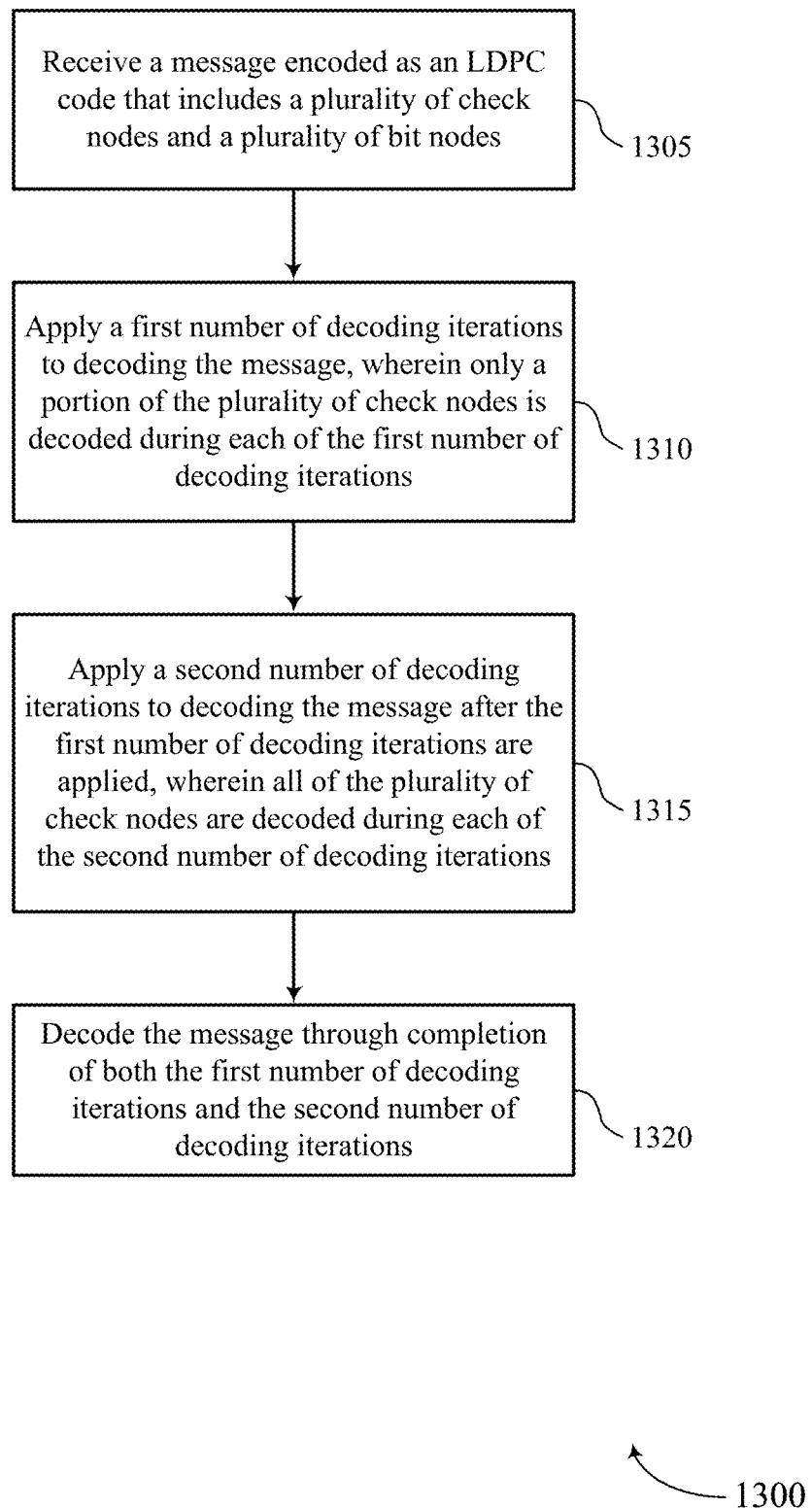
FIGS. 13 through 14 illustrate methods for scheduling for LDPC codes in accordance with aspects of the present disclosure.

FIG. 13 shows a flowchart illustrating a method 1300 for scheduling for LDPC codes in accordance with aspects of the present disclosure. The operations of method 1300 may be implemented by a UE 115 or base station 105 or its components as described herein. For example, the operations of method 1300 may be performed by a communications manager as described with reference to FIGS. 8 through 10. In some examples, a UE 115 or base station 105 may execute a set of codes to control the functional elements of the device to perform the functions described herein. Additionally or alternatively, the UE 115 or base station 105 may perform aspects of the functions described herein using special-purpose hardware.

At 1305 the UE 115 or base station 105 may receive a message encoded as an LDPC code that includes a number of check nodes and a number of bit nodes. The operations of 1305 may be performed according to the methods described herein. In certain examples, aspects of the operations of 1305 may be performed by a receiver as described with reference to FIGS. 8 through 10.

At 1310 the UE 115 or base station 105 may apply a first number of decoding iterations to decoding the message, where only a portion of the number of check nodes is decoded during each of the first number of decoding iterations. The operations of 1310 may be performed according to the methods described herein. In certain examples, aspects of the operations of 1310 may be performed by a decoding component as described with reference to FIGS. 8 through 10.

At 1315 the UE 115 or base station 105 may apply a second number of decoding iterations to decoding the message after the first number of decoding iterations are applied, where all of the number of check nodes are decoded during each of the second number of decoding iterations. The operations of 1315 may be performed according to the methods described herein. In certain examples, aspects of the operations of 1315 may be performed by a decoding component as described with reference to FIGS. 8 through 10.

At 1320 the UE 115 or base station 105 may decode the message through completion of both the first number of decoding iterations and the second number of decoding iterations. The operations of 1320 may be performed according to the methods described herein. In certain examples, aspects of the operations of 1320 may be performed by a decoding component as described with reference to FIGS. 8 through 10.

Figure 14:
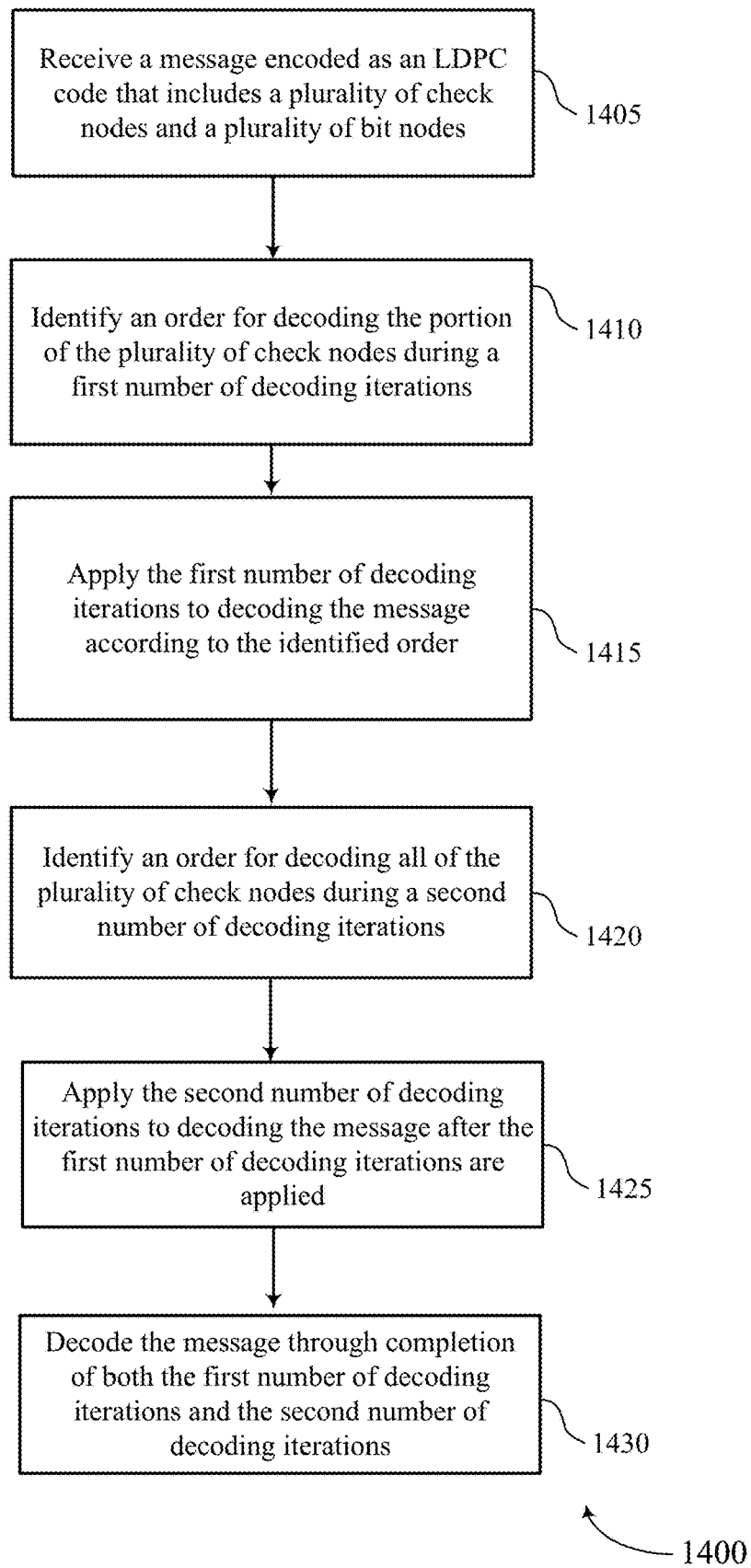

FIG. 14 shows a flowchart illustrating a method 1400 for scheduling for LDPC codes in accordance with aspects of the present disclosure. The operations of method 1400 may be implemented by a UE 115 or base station 105 or its components as described herein. For example, the operations of method 1400 may be performed by a communications manager as described with reference to FIGS. 8 through 10. In some examples, a UE 115 or base station 105 may execute a set of codes to control the functional elements of the device to perform the functions described herein. Additionally or alternatively, the UE 115 or base station 105 may perform aspects of the functions described herein using special-purpose hardware.

At 1405 the UE 115 or base station 105 may receive a message encoded as an LDPC code that includes a number of check nodes and a number of bit nodes. The operations of 1405 may be performed according to the methods described herein. In certain examples, aspects of the operations of 1405 may be performed by a receiver as described with reference to FIGS. 8 through 10.

At 1410 the UE 115 or base station 105 may identify an order for decoding the portion of the number of check nodes during a first number of decoding iterations. The operations of 1410 may be performed according to the methods described herein. In certain examples, aspects of the operations of 1410 may be performed by an order component as described with reference to FIGS. 8 through 10.

At 1415 the UE 115 or base station 105 may apply the first number of decoding iterations to decoding the message, where only a portion of the number of check nodes is decoded during each of the first number of decoding iterations. In some cases, the first number of decoding iterations are applied according to the identified order. The operations of 1415 may be performed according to the methods described herein. In certain examples, aspects of the operations of 1415 may be performed by a decoding component as described with reference to FIGS. 8 through 10.

At 1420 the UE 115 or base station 105 may identify an order for decoding all of the number of check nodes during a second number of decoding iterations. The operations of 1420 may be performed according to the methods described herein. In certain examples, aspects of the operations of 1420 may be performed by an order component as described with reference to FIGS. 8 through 10.

At 1425 the UE 115 or base station 105 may apply the second number of decoding iterations to decoding the message after the first number of decoding iterations are applied, where all of the number of check nodes are decoded during each of the second number of decoding iterations. In some cases, the second number of decoding iterations are applied according to the identified order. The operations of 1425 may be performed according to the methods described herein. In certain examples, aspects of the operations of 1425 may be performed by a decoding component as described with reference to FIGS. 8 through 10.

At 1430 the UE 115 or base station 105 may decode the message through completion of both the first number of decoding iterations and the second number of decoding iterations. The operations of 1430 may be performed according to the methods described herein. In certain examples, aspects of the operations of 1430 may be performed by a decoding component as described with reference to FIGS. 8 through 10.

It should be noted that the methods described herein describe possible implementations, and that the operations and the steps may be rearranged or otherwise modified and that other implementations are possible. Further, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1×, 1×, etc. IS-856 (TIA-856) is commonly referred to as CDMA2000 1×EV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE, LTE-A, and LTE-A Pro are releases of UMTS that use E-UTRA. UTRA, E-UTRA, UMTS, LTE, LTE-A, LTE-A Pro, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned herein as well as other systems and radio technologies. While aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR applications.

A macro cell generally covers a relatively large geographic area (e.g., several kilometers in radius) and may allow unrestricted access by UEs 115 with service subscriptions with the network provider. A small cell may be associated with a lower-powered base station 105, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs 115 with service subscriptions with the network provider. A femto cell may also cover a small geographic area (e.g., a home) and may provide restricted access by UEs 115 having an association with the femto cell (e.g., UEs 115 in a closed subscriber group (CSG), UEs 115 for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications system 100 or systems described herein may support synchronous or asynchronous operation. For synchronous operation, the base stations 105 may have similar frame timing, and transmissions from different base stations 105 may be approximately aligned in time. For asynchronous operation, the base stations 105 may have different frame timing, and transmissions from different base stations 105 may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may include random-access memory (RAM), read-only memory (ROM), electrically erasable programmable read only memory (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
receiving a message encoded as a low-density parity-check (LDPC) code that includes a plurality of check nodes and a plurality of bit nodes;
applying a first number of decoding iterations to decoding the message, wherein only a portion of the plurality of check nodes is decoded during each of the first number of decoding iterations;
applying a second number of decoding iterations to decoding the message after the first number of decoding iterations are applied, wherein all of the plurality of check nodes are decoded during each of the second number of decoding iterations; and
decoding the message through completion of both the first number of decoding iterations and the second number of decoding iterations.

2. The method of claim 1, further comprising:
identifying the portion of the plurality of check nodes as low-degree check nodes having a degree that is less than a threshold.

3. The method of claim 1, further comprising:
identifying an order for decoding the portion of the plurality of check nodes during the first number of decoding iterations, wherein the first number of decoding iterations are applied according to the identified order.

4. The method of claim 1, further comprising:
identifying an order for decoding all of the plurality of check nodes during the second number of decoding iterations, wherein the second number of decoding iterations are applied according to the identified order.

5. The method of claim 1, wherein a first order of the first number of decoding iterations is different from a second order of the second number of decoding iterations.

6. The method of claim 1, further comprising:
reordering the plurality of check nodes for decoding during one or both of the first number of decoding iterations and the second number of decoding iterations based at least in part on a scheduling configuration.

7. The method of claim 6, further comprising:
identifying the scheduling configuration based at least in part on a rate of the LDPC code.

8. The method of claim 7, wherein identifying the scheduling configuration comprises:
selecting the scheduling configuration from a plurality of scheduling configurations which vary from supporting a high rate of the LDPC code to a low rate of the LDPC code.

9. The method of claim 8, wherein the scheduling configuration selected from the plurality of scheduling configurations supporting a low rate of the LDPC code is extended from the scheduling configuration selected from the plurality of scheduling configurations supporting a high rate of the LDPC code.

10. The method of claim 1, further comprising:
reordering the plurality of check nodes for decoding during one or both of the first number of decoding iterations and the second number of decoding iterations based at least in part on a degree of each of the plurality of check nodes.

11. The method of claim 1, further comprising:
determining a number of punctured bits connected to each of the plurality of check nodes.

12. The method of claim 11, further comprising:
reordering the plurality of check nodes for decoding during one or both of the first number of decoding iterations and the second number of decoding iterations based at least in part on the number of punctured bits connected to each of the plurality of check nodes.

13. The method of claim 11, wherein the number of punctured bits is limited to a number of punctured bits within a range of the plurality of bit nodes, the number of punctured bits limited to the number of punctured bits within a first bit node and a second bit node of the plurality of bit nodes in a base graph.

14. The method of claim 11, wherein a number of bits in each bit node is based at least in part on a lifting size of the LDPC code.

15. The method of claim 1, further comprising:
reordering the plurality of check nodes for decoding during one or both of the first number of decoding iterations and the second number of decoding iterations based at least in part on an extrinsic information transfer (EXIT) chart optimization.

16. The method of claim 15, wherein the EXIT chart optimization minimizes an average bit error rate of a number of systematic bits.

17. An apparatus for wireless communication, comprising:
means for receiving a message encoded as a low-density parity-check (LDPC) code that includes a plurality of check nodes and a plurality of bit nodes;
means for applying a first number of decoding iterations to decoding the message, wherein only a portion of the plurality of check nodes is decoded during each of the first number of decoding iterations;
means for applying a second number of decoding iterations to decoding the message after the first number of decoding iterations are applied, wherein all of the plurality of check nodes are decoded during each of the second number of decoding iterations; and
means for decoding the message through completion of both the first number of decoding iterations and the second number of decoding iterations.

18. The apparatus of claim 17, further comprising:
means for identifying the portion of the plurality of check nodes as low-degree check nodes having a degree that is less than a threshold.

19. The apparatus of claim 17, further comprising:
means for identifying an order for decoding the portion of the plurality of check nodes during the first number of decoding iterations, wherein the first number of decoding iterations are applied according to the identified order.

20. The apparatus of claim 17, further comprising:
means for identifying an order for decoding all of the plurality of check nodes during the second number of decoding iterations, wherein the second number of decoding iterations are applied according to the identified order.

21. The apparatus of claim 17, wherein a first order of the first number of decoding iterations is different from a second order of the second number of decoding iterations.

22. The apparatus of claim 17, further comprising:
means for reordering the plurality of check nodes for decoding during one or both of the first number of decoding iterations and the second number of decoding iterations based at least in part on a scheduling configuration.

23. The apparatus of claim 22, further comprising:
means for identifying the scheduling configuration based at least in part on a rate of the LDPC code.

24. The apparatus of claim 23, wherein means for identifying the scheduling configuration comprises:
means for selecting the scheduling configuration from a plurality of scheduling configurations which vary uniformly from supporting a high rate of the LDPC code to a low rate of the LDPC code.

25. The apparatus of claim 17, further comprising:
means for reordering the plurality of check nodes for decoding during one or both of the first number of decoding iterations and the second number of decoding iterations based at least in part on a degree of each of the plurality of check nodes.

26. An apparatus for wireless communication, comprising:
a processor;
memory coupled with the processor; and
instructions stored in the memory and executable by the processor to cause the apparatus to:
receive a message encoded as a low-density parity-check (LDPC) code that includes a plurality of check nodes and a plurality of bit nodes;
apply a first number of decoding iterations to decoding the message, wherein only a portion of the plurality of check nodes is decoded during each of the first number of decoding iterations;
apply a second number of decoding iterations to decoding the message after the first number of decoding iterations are applied, wherein all of the plurality of check nodes are decoded during each of the second number of decoding iterations; and
decode the message through completion of both the first number of decoding iterations and the second number of decoding iterations.

27. The apparatus of claim 26, wherein the instructions are further executable by the processor to cause the apparatus to:
determine a number of punctured bits connected to each of the plurality of check nodes.

28. The apparatus of claim 27, wherein the instructions are further executable by the processor to cause the apparatus to:
reorder the plurality of check nodes for decoding during one or both of the first number of decoding iterations and the second number of decoding iterations based at least in part on the number of punctured bits connected to each of the plurality of check nodes.

29. The apparatus of claim 27, wherein the number of punctured bits is limited to a number of punctured bits within a range of the plurality of bit nodes, the number of punctured bits limited to the number of punctured bits within a first bit node and a second bit node of the plurality of bit nodes.

30. A non-transitory computer-readable medium storing code for wireless communication, the code comprising instructions executable by a processor to:
receive a message encoded as a low-density parity-check (LDPC) code that includes a plurality of check nodes and a plurality of bit nodes;
apply a first number of decoding iterations to decoding the message, wherein only a portion of the plurality of check nodes is decoded during each of the first number of decoding iterations; and
decode the message through completion of both the first number of decoding iterations and the second number of decoding iterations.

* * * * *